(12) United States Patent
Kim et al.

(10) Patent No.: US 12,156,434 B2
(45) Date of Patent: Nov. 26, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Yongseok Kim, Yongin-si (KR); Dongwon Kim, Yongin-si (KR); Sangwoo Kim, Yongin-si (KR); Gyujeong Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 417 days.

(21) Appl. No.: 17/569,899

(22) Filed: Jan. 6, 2022

(65) Prior Publication Data

US 2022/0223666 A1    Jul. 14, 2022

(30) Foreign Application Priority Data

Jan. 8, 2021 (KR) .................. 10-2021-0002584

(51) Int. Cl.
| | |
|---|---|
| *H01L 23/00* | (2006.01) |
| *H10K 50/844* | (2023.01) |
| *H10K 59/122* | (2023.01) |
| *H10K 59/131* | (2023.01) |
| *H10K 59/35* | (2023.01) |
| *H10K 71/00* | (2023.01) |
| *H10K 59/12* | (2023.01) |

(52) U.S. Cl.
CPC ......... *H10K 59/122* (2023.02); *H10K 50/844* (2023.02); *H10K 59/131* (2023.02); *H10K 59/353* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 10,121,844 | B2 | 11/2018 | Park et al. |
| 10,873,053 | B2 | 12/2020 | Sung et al. |
| 2020/0168824 | A1 | 5/2020 | Park et al. |
| 2020/0176520 | A1 | 6/2020 | Kim et al. |

FOREIGN PATENT DOCUMENTS

| | | |
|---|---|---|
| CN | 110741489 A | 1/2020 |
| KR | 101973163 B1 | 4/2019 |
| KR | 1020200026381 A | 3/2020 |
| KR | 1020200042140 A | 4/2020 |
| KR | 1020200064231 A | 6/2020 |
| KR | 1020200067576 A | 6/2020 |

*Primary Examiner* — Anthony Ho
(74) *Attorney, Agent, or Firm* — CANTOR COLBURN LLP

(57) ABSTRACT

A display apparatus includes: a substrate including a first area and a plurality of second areas extending from the first area in different directions from each other; a light emitting device disposed on the first area and including a first electrode, a second electrode, and an intermediate layer between the first electrode and the second electrode; a first organic layer disposed on the first area, where a distance from an upper surface of the first organic layer to an upper surface of the substrate is greater than a distance from an upper surface of the first electrode to the upper surface of the substrate; and a disconnection portion disposed on the first organic layer and including a tip, an edge of an upper surface of which more protrudes away from a center of the first organic layer than an edge of the upper surface of the first organic layer.

10 Claims, 30 Drawing Sheets

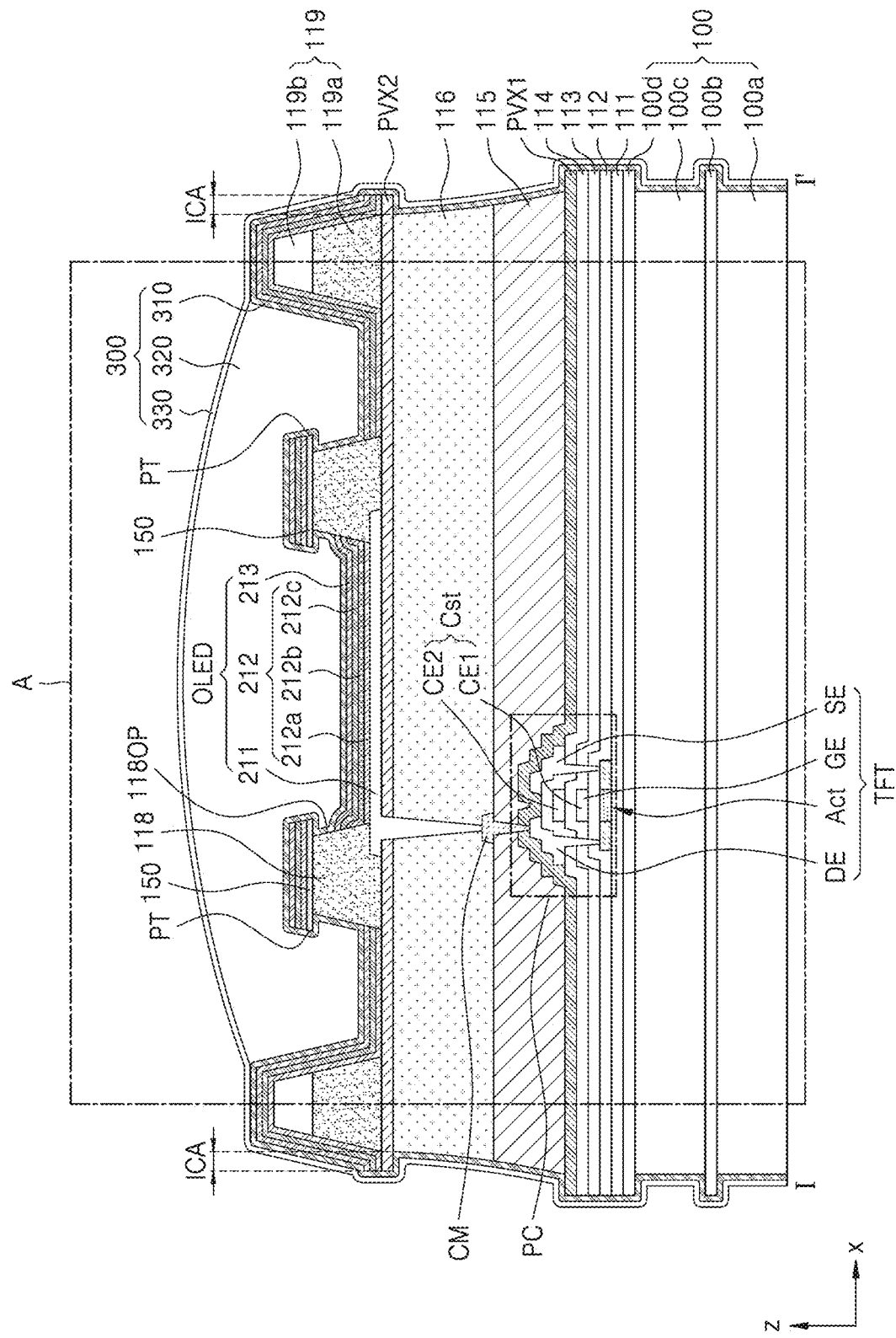

DISPLAY APPARATUS AND METHOD OF MANUFACTURING THE SAME

This application claims priority to Korean Patent Application No. 10-2021-0002584, filed on Jan. 8, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus with improved light efficiency while preventing damage to a display apparatus when a substrate is deformed and a method of manufacturing the display apparatus.

2. Description of the Related Art

Display apparatuses may visually display data. A display apparatus may be used as a display unit of a small-sized product such as a mobile phone or may be used as a display unit of a large-sized product such as a television.

Recently, as the use of display apparatuses has diversified, various attempts have been made to improve the quality and function of display apparatuses. Particularly, research and development has been actively conducted on flexible display apparatuses that may be folded or rolled in a roll shape, stretchable display apparatuses that may be changed into various forms, and the like.

SUMMARY

One or more embodiments include a display apparatus with improved light efficiency while preventing damage to a display apparatus when a substrate is deformed and a method of manufacturing the display apparatus.

According to an embodiment, a display apparatus includes a substrate including a first area and a plurality of second areas extending from the first area in different directions from each other, a light emitting device disposed on the first area, where the light emitting device includes a first electrode, a second electrode, and an intermediate layer disposed between the first electrode and the second electrode, a first organic layer which is disposed on the first area and extends such that the light emitting device is disposed in an inside thereof, where a distance from an upper surface of the first organic layer to an upper surface of the substrate is greater than a distance from an upper surface of the first electrode to the upper surface of the substrate, and a disconnection portion disposed on the first organic layer, where the disconnection portion includes a tip, an edge of an upper surface of which more protrudes in a direction away from a center of the first organic layer than an edge of the upper surface of the first organic layer.

According to an embodiment, the intermediate layer may include a functional layer, and the functional layer may cover the first area and may include a portion disposed on the disconnection portion and disconnected by the tip.

According to an embodiment, the second electrode may cover the first area and may include a portion disposed on the disconnection portion and disconnected by the tip.

According to an embodiment, the display apparatus may further include a pixel definition layer disposed on the first electrode, where a pixel opening may be defined through the pixel definition layer to expose a portion of the upper surface of the first electrode, and the first organic layer and the pixel definition layer may include a same material as each other and may have a same layer structure as each other.

According to an embodiment, the display apparatus may further include a pixel definition layer disposed on the first electrode, where a pixel opening may be defined through the pixel definition layer to expose a portion of the upper surface of the first electrode, and an additional organic layer disposed on the pixel definition layer, where an opening may be defined through the additional organic layer to overlap the pixel opening, where the first organic layer and the additional organic layer may include a same material as each other and may have a same layer structure as each other.

According to an embodiment, the disconnection portion may include a first portion which covers at least a portion of the upper surface of the first organic layer, where a shape of a lower surface of the first portion may be substantially the same as a shape of a corresponding portion of the upper surface of the first organic layer, a second portion which extends from an end of the first portion to an edge of the first organic layer, where a shape of a lower surface of the second portion may be substantially the same as the shape of a corresponding portion of the upper surface of the first organic layer, and a third portion extending from an end of the second portion in a direction away from the first organic layer.

According to an embodiment, the disconnection portion may include a first portion which covers at least a portion of the upper surface of the first organic layer, where a shape of a lower surface of the first portion may be substantially the same as a shape of a corresponding portion of the upper surface of the first organic layer, and a second portion which extends from another end of the first portion in a direction away from the first organic layer, where a lower surface of the second portion may be spaced apart from the upper surface of the first organic layer.

According to an embodiment, the display apparatus may further include an encapsulation layer covering an upper surface of the second electrode, a side surface of the first organic layer, and a side surface of the disconnection portion, where the encapsulation layer may include an inorganic encapsulation layer and an organic encapsulation layer.

According to an embodiment, the display apparatus may further include a power supply line disposed on at least one of the plurality of second areas and extending toward the first area, and a connection electrode disposed on the first area and electrically connected to the second electrode and the power supply line.

According to an embodiment, the display apparatus may further include a second organic layer covering at least a portion of the connection electrode and at least a portion of the first electrode, wherein the disconnection portion may not overlap the second organic layer.

According to an embodiment, a method of manufacturing a display apparatus includes providing a first electrode over a first area of a substrate, providing an organic material layer covering the first area and patterning the organic material layer to form a first organic layer which extends such that the first electrode is located in an inside thereof, where a distance from an upper surface of the first organic layer to an upper surface of the substrate is greater than a distance from an upper surface of the first electrode to the upper surface of the substrate, providing a sacrificial material layer covering the first area and patterning the sacrificial material layer to form a sacrificial layer through which an opening is defined to expose the upper surface of the first organic layer, providing an inorganic material layer covering the first area and patterning the inorganic material layer to form a disconnection portion disposed on the first organic layer, where the disconnection portion includes a tip, an edge of an upper surface of which more protrudes in a direction away from a center of the first organic layer than an edge of the upper surface of the first organic layer, removing the sacrificial layer, and providing an intermediate layer covering the first area and a second electrode covering the intermediate layer.

According to an embodiment, the intermediate layer may include are functional layer, and the functional layer may include a portion disposed on the disconnection portion and disconnected by the tip.

According to an embodiment, the second electrode may include a portion disposed on the disconnection portion and disconnected by the tip.

According to an embodiment, the providing the first organic layer may include patterning the organic material layer to form the first organic layer and a pixel definition layer disposed on the first electrode, where a pixel opening may be defined through the pixel definition layer to expose a portion of the upper surface of the first electrode.

According to an embodiment, the method may further include providing a pixel definition layer disposed on the first electrode, where a pixel opening is defined through the pixel definition layer to expose a portion of the upper surface of the first electrode, where the providing the first organic layer may include patterning the organic material layer to form the first organic layer and an additional organic layer disposed on the pixel definition layer, where an opening may be defined through the additional organic layer to overlap the pixel opening.

According to an embodiment, the providing the sacrificial layer may include performing a patterning process by aligning a mask such that an edge of an opening of the mask matches an edge of the first organic layer.

According to an embodiment, the disconnection portion may include a first portion which covers at least a portion of the upper surface of the first organic layer, where a shape of a lower surface of the first portion may be substantially the same as a shape of a corresponding portion of the upper surface of the first organic layer, a second portion which extends from an end of the first portion to an edge of the first organic layer, where a shape of a lower surface of the second portion may be substantially the same as the shape of a corresponding portion of the upper surface of the first organic layer, and a third portion extending from an end of the second portion in a direction away from the first organic layer.

According to an embodiment, the providing the sacrificial layer may include performing a patterning process by aligning a mask such that an edge of an opening of the mask is closer to the center of the first organic layer than an edge of the first organic layer.

According to an embodiment, the disconnection portion may include a first portion which covers at least a portion of the upper surface of the first organic layer, where a shape of a lower surface of the first portion is may be substantially the same as a shape of a corresponding portion of the upper surface of the first organic layer, and a second portion which extends from an end of the first portion in a direction away from the first organic layer, where a lower surface of the second portion may be spaced apart from the upper surface of the first organic layer.

According to an embodiment, the method may further include providing an encapsulation layer covering an upper surface of the second electrode, a side surface of the first organic layer, and a side surface of the disconnection portion, where the encapsulation layer may include an inorganic encapsulation layer and an organic encapsulation layer.

Other features of embodiments of the invention other than those described above will become apparent from the following detailed description, the appended claims, and the accompanying drawings.

Also, these general and particular features of the embodiments of the invention may be implemented by using systems, methods, computer programs, or any combinations of systems, methods, and computer programs.

BRIEF DESCRIPTION OF THE DRAWINGS

The above and other features of certain embodiments will be more apparent from the following description taken in conjunction with the accompanying drawings, in which:

FIG. 5A is a cross-sectional view schematically illustrating a portion of a display apparatus according to an embodiment;

DETAILED DESCRIPTION

Figure 1A:
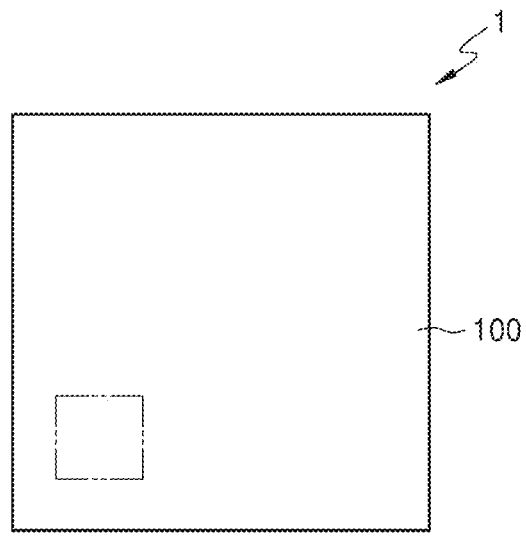
FIG. 1A is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
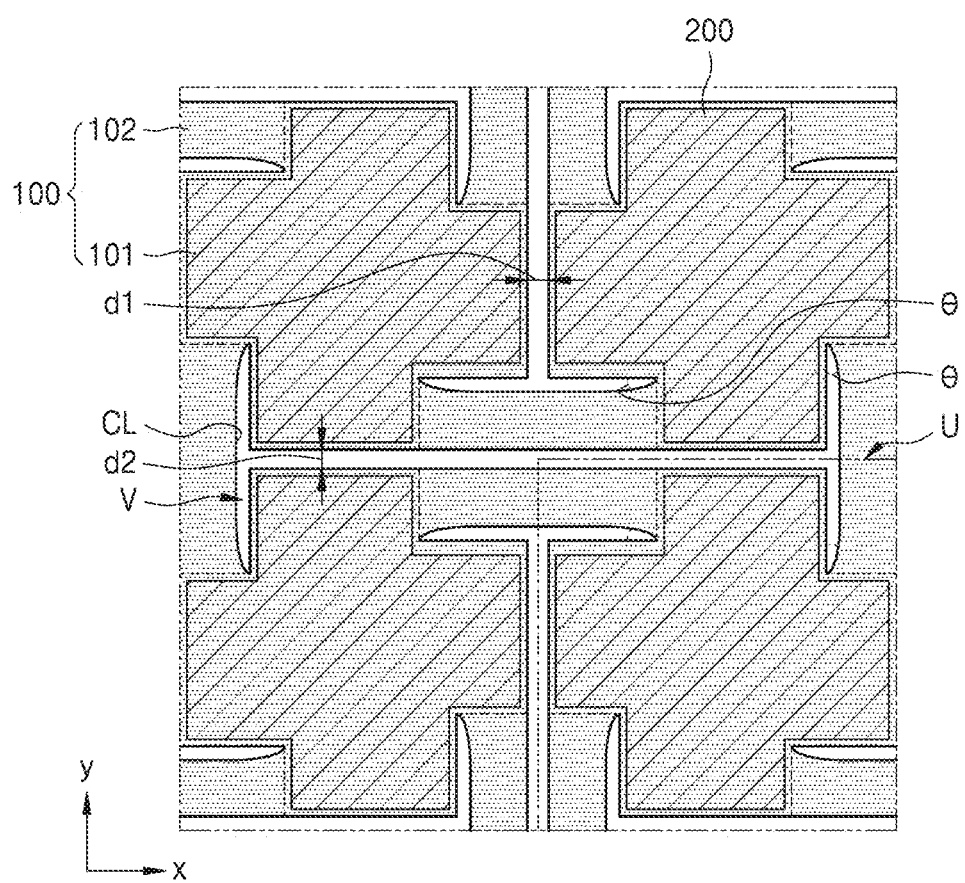
FIG. 1B is an enlarged view of the encircled portion of FIG. 1A.
Figure 2:
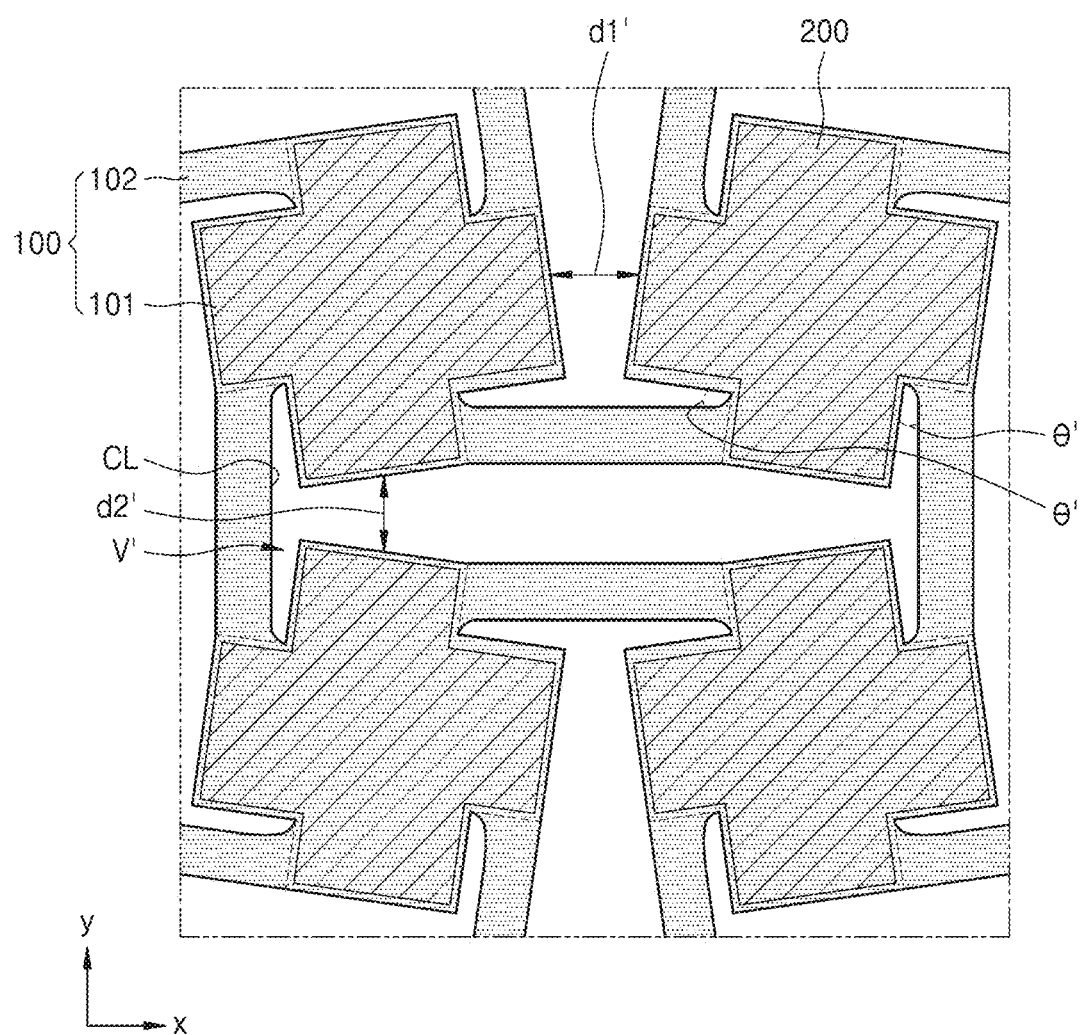
FIG. 2 is an enlarged plan view of the encircled portion of FIG. 1A in an alternate configuration.

FIG. 1A is a plan view schematically illustrating a display apparatus 1 according to an embodiment, FIG. 1B is an enlarged view of the encircled portion of FIG. 1A, and FIG. 2 is an enlarged plan view of the encircled portion of FIG. 1A in an alternate configuration.

Referring to FIG. 1A, the display apparatus 1 may include a substrate 100 and a display unit 200 disposed on or located over the substrate 100.

In an embodiment, the substrate 100 may include various materials such as glass, metal, or organic material. In an alternative embodiment, the substrate 100 may include a flexible material. In one embodiment, for example, the substrate 100 may include ultra-thin flexible glass (e.g., a thickness of tens to hundreds of μm) or polymer resin. In an embodiment where the substrate 100 includes polymer resin, the substrate 100 may include polyimide. Alternatively, the substrate 100 may include polyethersulfone, polyarylate, polyetherimide, polyethylene naphthalate, polyethylene terephthalate ("PET"), polyphenylene sulfide, polycarbonate, cellulose triacetate, and/or cellulose acetate propionate.

In an embodiment, as shown in FIG. 1B, the substrate 100 may include a plurality of first areas 101 spaced apart from each other, a plurality of second areas 102 connecting the plurality of first areas 101 to each other, and a plurality of separation areas V defined through the substrate 100 between the plurality of second areas 102.

Each of the plurality of first areas 101 may have an isolated shape and may be an isolated area. The first areas 101 may be arranged apart from each other. Although FIGS. 1A and 1B illustrates an embodiment where the first area 101 has an approximately a cross-like ("+") shape, the disclosure is not limited thereto and the shape of the first area 101 may be variously modified. The plurality of first areas 101 may form or constitute a grid pattern by being repeatedly arranged in a first direction (e.g., x direction) and a second direction (e.g., y direction) intersecting with the first direction. In an embodiment, the first direction and the second direction may be perpendicular to each other. In an alternative embodiment, the first direction and the second direction may form an obtuse angle or an acute angle therebetween.

In an embodiment, a display unit 200 may be disposed on or located over each of the plurality of first areas 101. The display unit 200 may include at least one pixel, and the pixel may include a light emitting device that emits light in the visible band. In one embodiment, for example, a red pixel, a green pixel, a blue pixel, and/or a white pixel may be arranged on each of the first areas 101.

The plurality of second areas 102 may be a portion that connects the adjacent first areas 101 to each other. Each of the second areas 102 may be connected to a first area 101 and another first area 101 arranged adjacent thereto. In an embodiment, each of the first areas 101 may be connected to four second areas 102 extending in different directions and may be connected to the adjacent first areas 101 through the second areas 102. In one embodiment, for example, a first area 101 may be connected to four first areas 101 arranged in a direction surrounding the first area 101. In an alternative embodiment, the plurality of first areas 101 and the plurality of second areas 102 may be integrally formed with each other as a single unitary unit.

Hereinafter, for convenience of description, one first area 101 and the second areas 102 connected thereto will be defined as one basic unit U. The basic unit U may be repeatedly arranged in the first direction and the second direction, and the substrate 100 may be understood as being formed by connecting the repeatedly-arranged basic units U to each other. Two basic units U adjacent to each other may be symmetrical to each other. In one embodiment, for example, two basic units U adjacent to each other in the horizontal direction may be horizontally symmetrical with respect to a symmetry axis that is located therebetween and is parallel to the y direction. In such an embodiment, two basic units U adjacent to each other in the vertical direction may be vertically symmetrical with respect to a symmetry axis that is located therebetween and is parallel to the x direction.

Among a plurality of basic units U, adjacent basic units U, for example, four basic units U illustrated in FIG. 1B may form a closed curve CL therebetween. The closed curve CL may define a separation area V that is an empty space. In one embodiment, for example, the separation area V may be defined by the closed curve CL formed by edges of a plurality of first areas 101 and edges of a plurality of second areas 102.

The separation areas V may penetrate or be defined through the upper and lower surfaces of the substrate 100. The substrate 100 and the components over the substrate 100 may not be arranged in the separation areas V. In such an embodiment, as a display panel includes the separation areas V, a weight of the display panel may be reduced and flexibility of the display panel may be improved. In such an embodiment, when an external force (e.g., a curving, bending, or pulling force) is applied to the display panel, the shape of the separation areas V may change. Accordingly, when the display panel is deformed, stress generated therein due to the deformation may be easily reduced to prevent abnormal deformation of the display panel and improve the durability thereof.

The arrangement of the first area 101 and the second areas 102 included in the basic unit U may vary. Particularly, when an external force, such as a pulling force (i.e., a force for pulling the substrate 100), is applied to the substrate 100, the angle between the edge of the first area 101 and the edge of the second area 102 and the area or shape of the separation area V may be changed.

FIG. 1B shows a shape of the substrate 100 when an external force is not applied thereto, and FIG. 2 shows a shape of the substrate 100 stretched in the first direction and the second direction when the external force is applied thereto. Referring to FIGS. 1B and 2, when an external force is applied to the substrate 100, the angle between the edge of the first area 101 and the edge of the second area 102 may increase from 8 to 8' and a separation area V' having a changed area and/or shape may be formed. Accordingly, each of the first areas 101 may rotate at a certain angle, and the distance between the first areas 101 may change. In one embodiment, for example, a first distance between the first areas 101 may change from d1 to d1', and a second distance between the first areas 101 may change from d2 to d2'. In such an embodiment, the change in the distance between the first areas 101 may vary by position.

In an embodiment, when a pulling force is applied to the substrate 100, because a stress may be concentrated on the second area 102 connected to the edge of the first area 101, a closed curve CL defining a separation area V may include a curve to prevent damage to the display panel.

Figure 3:
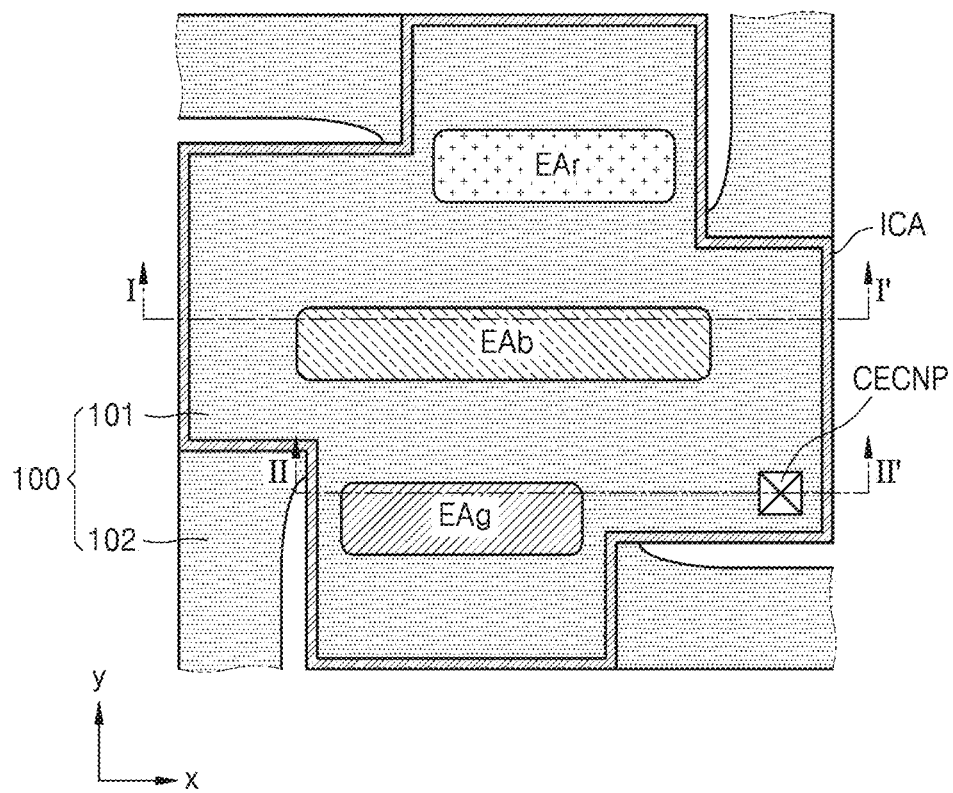
FIG. 3 is a plan view schematically illustrating a structure over a basic unit included in a display apparatus according to an embodiment.
Figure 4:
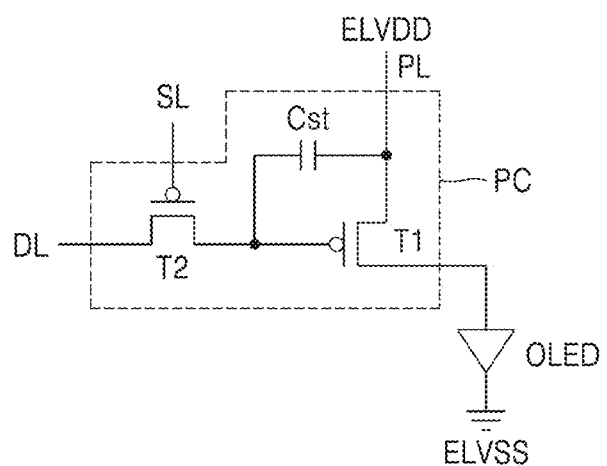
FIG. 4 is an equivalent circuit diagram of a pixel included in a display apparatus according to an embodiment.

FIG. 3 is a plan view schematically illustrating a structure over a basic unit included in a display apparatus according to an embodiment, and FIG. 4 is an equivalent circuit diagram of a pixel included in a display apparatus according to an embodiment.

Referring to FIG. 3, pixels each including a light emitting device may be arranged over the first area 101 of the substrate 100. Light emitted from the light emitting device may be provided through an emission area having a certain area in the plan view. FIG. 3 illustrates an emission area of each of the pixels over a basic unit. In one embodiment, for example, a red emission area EAr, a blue emission area EAb, and a green emission area EAg may be disposed on or located over the first area 101.

In an embodiment, as illustrated in FIG. 4, each of the pixels may include a pixel circuit PC and a light emitting device electrically connected to the pixel circuit PC. In an embodiment, the light emitting device may include an organic light emitting diode, an inorganic light emitting diode, or a quantum dot light emitting diode. Hereinafter, for convenience of description, embodiments where each of the pixels includes an organic light emitting diode OLED as a light emitting device will be described in detail.

The pixel circuit PC may include a first thin film transistor T1, a second thin film transistor T2, and a storage capacitor Cst. Each pixel may emit, for example, red, green, or blue light or red, green, blue, or white light from the organic light emitting diode OLED. As a switching thin film transistor, the second transistor T2 may be connected to a scan line SL and a data line DL and may be configured to transmit a data voltage input from the data line DL to the first thin film transistor T1 in response to a switching voltage input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

As a driving thin film transistor, the first thin film transistor T1 may be connected to the driving voltage line PL and the storage capacitor Cst and may be configured to control a driving current flowing from the driving voltage line PL through the organic light emitting diode OLED in response to a voltage value stored in the storage capacitor Cst. The organic light emitting diode OLED may emit light with a certain brightness corresponding to the driving current. A second electrode (e.g., a cathode) of the organic light emitting diode OLED may be supplied with a second power voltage ELVSS.

Although FIG. 4 illustrates an embodiment where the pixel circuit PC includes two thin film transistors T1 and T2 and a single storage capacitor Cst, the disclosure is not limited thereto. In embodiments of the invention, the number of thin film transistors and the number of storage capacitors may be variously modified according to the design of the pixel circuit PC.

In an embodiment, as shown in FIG. 3, the pixels over the first area 101 may be entirely surrounded by an inorganic contact area ICA. In such an embodiment, when viewed in a direction perpendicular to the upper surface (or a thickness direction) of the substrate 100, the inorganic contact area ICA may entirely surround the emission areas. In an embodiment, as shown in FIG. 3, the red emission area EAr of a red pixel, the blue emission area EAb of a blue pixel, and the green emission area EAg of a green pixel are entirely surrounded by the inorganic contact area ICA in the plan view; however, the disclosure is not limited thereto. In embodiments, the number and arrangement of pixels arranged over the first area 101 and surrounded by the inorganic contact area ICA may be variously modified according to design.

The inorganic contact area ICA may be an area formed by directly contacting at least two layers including an inorganic material and may prevent external moisture from penetrating into the light emitting device included in each pixel. The inorganic contact area ICA may extend along the edge of the first area 101, and the pixels may be arranged inside the inorganic contact area ICA. In an embodiment, a second electrode connection portion (hereinafter referred to as a connection portion) CECNP for applying a certain voltage to the second electrode of each organic light emitting diode OLED may be included inside the inorganic contact area ICA.

Figure 5B:
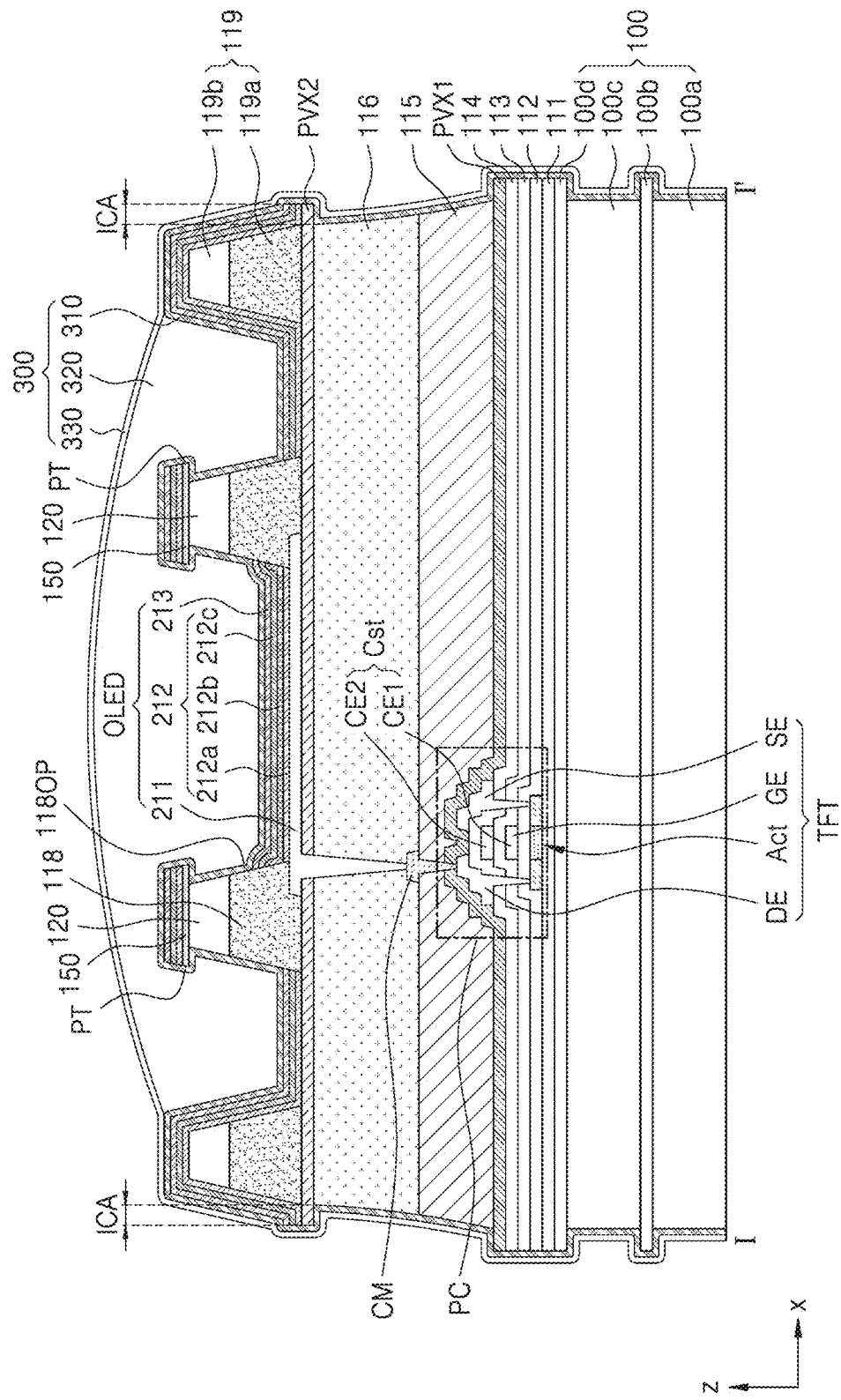
FIG. 5B is a cross-sectional view schematically illustrating a portion of a display apparatus according to an alternative embodiment.
Figure 5C:
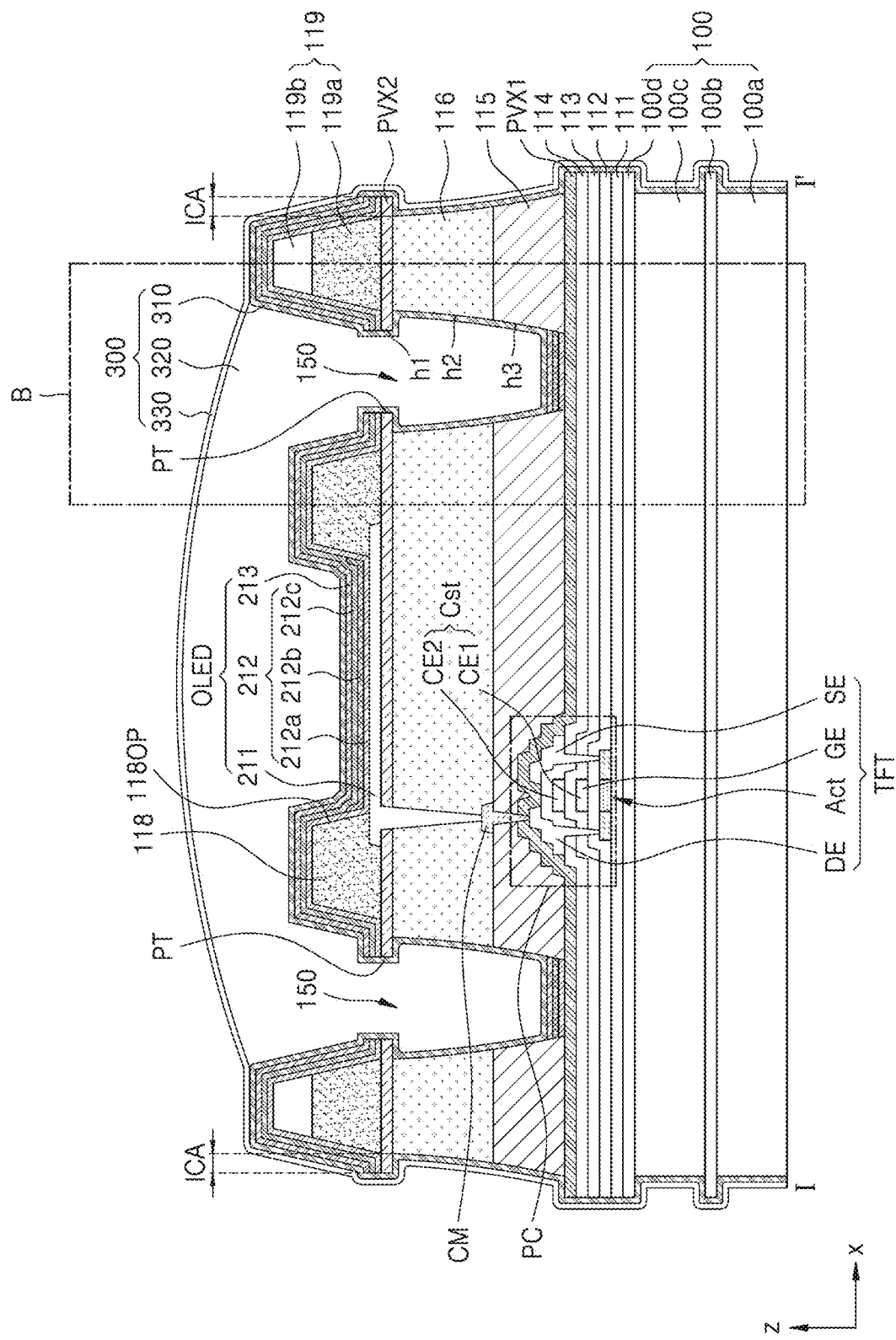
FIG. 5C is a cross-sectional view schematically illustrating a portion of a display apparatus according to another alternative embodiment.

FIG. 5A is a cross-sectional view schematically illustrating a portion of a display apparatus according to an embodiment, FIG. 5B is a cross-sectional view schematically illustrating a portion of a display apparatus according to an alternative embodiment, and FIG. 5C is a cross-sectional view schematically illustrating a portion of a display apparatus according to another alternative embodiment. FIGS. 5A to 5C may correspond to cross-sectional views of the display apparatus taken along line I-I' of FIG. 3.

Referring to FIGS. 5A to 5C, in an embodiment, the substrate 100 may include a base layer and a barrier layer. In an embodiment, the substrate 100 may include a first base layer 100a, a first barrier layer 100b, a second base layer 100c, and a second barrier layer 100d that are sequentially stacked one on another.

The first base layer 100a and the second base layer 100c may each include a polymer resin. The polymer resin may include polyethersulfone, polyarylate, polyetherimide, polyethylene naphthalate, PET, polyphenylene sulfide, polyimide, polycarbonate, cellulose triacetate, cellulose acetate propionate, or the like.

The first barrier layer 100b and the second barrier layer 100d may be barrier layers for preventing penetration of foreign substances. Each of the first barrier layer 100b and the second barrier layer 100d may include a single layer or multiple layers including an inorganic material such as silicon nitride, silicon oxynitride, and/or silicon oxide.

A pixel circuit PC and an organic light emitting diode OLED electrically connected to the pixel circuit PC may be disposed on or located over the first area 101 (see FIG. 3) of the substrate 100. The pixel circuit PC may include a thin film transistor TFT and a storage capacitor Cst as described above with reference to FIG. 4.

A buffer layer 111 may be disposed or arranged between the substrate 100 and the pixel circuit PC and may prevent impurities from penetrating into the thin film transistor TFT. The buffer layer 111 may include an inorganic insulating material such as silicon nitride, silicon oxynitride, or silicon oxide and may include a single layer or multiple layers including the inorganic insulating material.

The thin film transistor TFT may include a semiconductor layer Act, a gate electrode GE, a source electrode SE, and a drain electrode DE. FIG. 5A illustrates an embodiment in a top gate type in which a gate electrode GE is arranged over a semiconductor layer Act with a gate insulating layer 112 therebetween; however, according to an alternative embodiment, the thin film transistor TFT may be a bottom gate type.

The semiconductor layer Act may include polysilicon. Alternatively, the semiconductor layer Act may include amorphous silicon, may include an oxide semiconductor, or may include an organic semiconductor or the like. The gate electrode GE may include a low-resistance metal material. The gate electrode GE may include a conductive material including molybdenum (Mo), aluminum (Al), copper (Cu), titanium (Ti), or the like and may include a single layer or multiple layers including at least one selected from the above materials.

The gate insulating layer 112 between the semiconductor layer Act and the gate electrode GE may include an inorganic insulating material such as silicon oxide, silicon nitride, silicon oxynitride, aluminum oxide, titanium oxide, tantalum oxide, or hafnium oxide. The gate insulating layer 112 may include a single layer or multiple layers including at least one selected from the above materials.

The source electrode SE and the drain electrode DE may be disposed in a same layer as each other, for example, directly on a second interlayer insulating layer 114, and may include a same material as each other. The source electrode SE and the drain electrode DE may include a material having high conductivity. The source electrode SE and the drain electrode DE may include a conductive material including molybdenum (Mo), aluminum (Al), copper (Cu), titanium (Ti), or the like and may include a single layer or multiple layers including at least one selected from the above materials. In an embodiment, the source electrode SE and the drain electrode DE may include a multilayer structure of titanium layer, aluminum layer, and titanium layer (Ti/Al/Ti).

The storage capacitor Cst may include a lower electrode CE1 and an upper electrode CE2 overlapping each other with a first interlayer insulating layer 113 therebetween. The storage capacitor Cst may overlap the thin film transistor TFT. In an embodiment, as shown in FIG. 5A, the gate electrode GE of the thin film transistor TFT is the lower electrode CE1 of the storage capacitor Cst. In an alternative embodiment, the storage capacitor Cst may not overlap the thin film transistor TFT. The storage capacitor Cst may be covered by a second interlayer insulating layer 114. The upper electrode CE2 of the storage capacitor Cst may include a conductive material including molybdenum (Mo), aluminum (Al), copper (Cu), titanium (Ti), or the like and may include a single layer or multiple layers including at least one selected from the above materials.

The first interlayer insulating layer 113 and the second interlayer insulating layer 114 may include an inorganic insulating material such as silicon oxide, silicon nitride, or silicon oxynitride. The first interlayer insulating layer 113 and the second interlayer insulating layer 114 may include a single layer or multiple layers including at least one selected from the above materials.

The thin film transistor TFT and the storage capacitor Cst may be covered by a first organic insulating layer 115, and a first inorganic insulating layer PVX1 may be located under the first organic insulating layer 115. The first inorganic insulating layer PVX1 may include an inorganic insulating material such as silicon nitride, silicon oxide, or silicon oxynitride.

A second organic insulating layer 116 may be disposed over the first organic insulating layer 115. In alternative embodiments, the second organic insulating layer 116 may be omitted or an additional organic insulating layer may be disposed over the second organic insulating layer 116. The first organic insulating layer 115 and the second organic insulating layer 116 may include an organic insulating material. In one embodiment, for example, the first organic insulating layer 115 and the second organic insulating layer 116 may include at least one selected from a general-purpose polymer such as polymethylmethacrylate ("PMMA") or polystyrene ("PS"), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, and any blend thereof.

A second inorganic insulating layer PVX2 may be disposed on or located over the second organic insulating layer 116, and a first electrode 211 may be disposed on or located over the second inorganic insulating layer PVX2. The second inorganic insulating layer PVX2 may include an inorganic insulating material such as silicon nitride, silicon oxide, or silicon oxynitride.

The first electrode 211 may be electrically connected to the thin film transistor TFT of the pixel circuit PC. In an embodiment, as shown in FIG. 5A, the thin film transistor TFT and the first electrode 211 are electrically connected via a contact metal CM on the first organic insulating layer 115. In an embodiment, the contact metal CM may include a same material as and may have a same layer structure as the source electrode SE and the drain electrode DE.

The first electrode 211 may include a transparent conductive oxide such as indium tin oxide ("ITO"), indium zinc oxide ("IZO"), zinc oxide ("ZnO"), indium oxide ("In$_2$O$_3$"), indium gallium oxide ("IGO"), or aluminum zinc oxide ("AZO"). In an alternative embodiment, the first electrode 211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an alternative embodiment, the first electrode 211 may further include a layer formed of ITO, IZO, ZnO, or In$_2$O$_3$ over/under the reflection layer. In one embodiment, for example, the first electrode 211 may have a three-layer structure in which an ITO layer, a silver (Ag) layer, and an ITO layer are stacked.

A pixel definition layer 118 may cover an edge of the first electrode 211 and a pixel opening 1180P may be defined through the pixel definition layer 118 to overlap a central portion of the first electrode 211, thereby defining an emission area. In one embodiment, for example, the area of the pixel opening 1180P may correspond to the area of the emission area. In one embodiment, for example, the area of the pixel opening 1180P may correspond to the area of the red emission area EAr (see FIG. 3) of the red pixel described above with reference to FIG. 3. In such an embodiment, each of the blue emission area EAb (see FIG. 3) of the blue pixel and the green emission area EAg (see FIG. 3) of the green pixel may be defined by a pixel opening 1180P of the pixel definition layer 118 on the first electrode 211.

The pixel definition layer 118 may include an organic insulating material such as polyimide. Alternatively, the pixel definition layer 118 may include an inorganic insulating material. Alternatively, the pixel definition layer 118 may include an organic insulating material and an inorganic insulating material An intermediate layer 212 may be disposed over the pixel definition layer 118 and/or the first electrode 211. The intermediate layer 212 may include an emission layer 212b. The emission layer 212b may include an organic light emitting material such as a high-molecular or low-molecular weight organic material for emitting light of a preset color. Alternatively, the emission layer 212b may include an inorganic light emitting material or may include quantum dots. A first functional layer 212a and a second functional layer 212c may be respectively disposed under and over the emission layer 212b.

The first functional layer 212a may include a single layer or multiple layers. In one embodiment, for example, the first functional layer 212a may be a hole transport layer ("HTL") with a single-layer structure and may include or be formed of poly-(3,4)-ethylene-dioxy thiophene ("PEDOT") or polyaniline ("PANI"). Alternatively, the first functional layer 212a may include a hole injection layer ("HIL") and an HTL.

The second functional layer 212c may include a single layer or multiple layers. The second functional layer 212c may include an electron transport layer ("ETL") and/or an electron injection layer ("EIL").

FIGS. 5A to 5C illustrate embodiments where the intermediate layer 212 includes both the first functional layer 212a and the second functional layer 212c; however, in an alternative embodiment, the intermediate layer 212 may selectively include the first functional layer 212a and the second functional layer 212c. In one embodiment, for example, the intermediate layer 212 may not include the second functional layer 212c.

The emission layer 212b of the intermediate layer 212 may be provided for each pixel, whereas the first functional layer 212a and the second functional layer 212c may be integrally formed with each other as a single unitary unit to cover a plurality of pixels. In one embodiment, for example, each of the first functional layer 212a and the second functional layer 212c may be integrally formed with each other as a single unitary unit to cover the red, blue, and green emission areas EAr, EAb, and EAg (see FIG. 3) of the red, blue, and green pixels.

A second electrode 213 may include a conductive material having a low work function. In one embodiment, for example, the second electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 213 may further include a layer such as ITO, IZO, ZnO, or $In_2O_3$ over the (semi)transparent layer including at least one selected from the above materials. In one embodiment, for example, the second electrode 213 may be integrally formed with each other as a single unitary unit to cover the red, blue, and green emission areas EAr, EAb, and EAg (see FIG. 3) of the red, blue, and green pixels. In one embodiment, for example, the second electrode 213 may entirely cover the first area 101 of the substrate 100.

An upper portion of the second electrode 213 may be covered by an encapsulation layer 300. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330 that are sequentially stacked.

At least one inorganic encapsulation layer of the encapsulation layer 300 may directly contact a portion of the second inorganic insulating layer PVX2 in an edge area (peripheral area) of the first area 101 to form an inorganic contact area ICA. The first and second inorganic encapsulation layers 310 and 330 may each include one or more inorganic insulating materials. The inorganic insulating material may include aluminum oxide, tantalum oxide, hafnium oxide, zinc oxide, silicon oxide, silicon nitride, and/or silicon oxynitride. The organic encapsulation layer 320 may include a polymer-based material. The polymer-based material may include acryl-based resin, epoxy-based resin, polyimide, polyethylene, or the like. The acryl-based resin may include, for example, polymethyl methacrylate, polyacrylic acid, or the like.

The organic encapsulation layer 320 may be disposed only over each first area 101 of the substrate 100. Thus, the display apparatus 1 described above with reference to FIGS. 1A, 1B and 2 may be understood as including organic encapsulation layers 320 disposed over the first area 101 and spaced apart from each other.

The organic encapsulation layer 320 may cover a portion of a side surface of a dam portion 119 disposed on the second inorganic insulating layer PVX2 in the edge area of the first area 101. The dam portion 119 may include a first pattern layer 119a disposed on the second inorganic insulating layer PVX2 and a second pattern layer 119b disposed on the first pattern layer 119a. In an embodiment, the first pattern layer 119a and the second pattern layer 119b may be organic layers, e.g., a first organic layer and a second organic layer, respectively.

The first pattern layer 119a may be arranged adjacent to the separation area V (see FIG. 1B). In an embodiment, the first pattern layer 119a and the pixel definition layer 118 may include a same material as each other and have a same layer structure as each other. In alternative embodiments, the second pattern layer 119b may function as a spacer. The second pattern layer 119b may prevent damage to structures and layers arranged below the second pattern layer 119b in a display apparatus manufacturing process.

In an embodiment, a disconnection portion 150 may be disposed on the first area 101. The disconnection portion 150 may prevent defects such as damage to the light emitting device due to the inflow of moisture through the separation area V. In such an embodiment, the disconnection portion 150 may prevent moisture from penetrating into the first area 101, by disconnecting (or separating) a layer that may become a moisture movement path among the layers formed over the substrate 100. Among the layers on the substrate 100, a layer including an organic material may become a moisture propagation path. In one embodiment, for example, the disconnection portion 150 may disconnect the second electrode 213 and/or at least a portion of the functional layer (for example, the first functional layer 212a and/or the second functional layer 212c) included in the intermediate layer 212.

The disconnection portion 150 may extend or be located along the edge of the first area 101 and may entirely surround the pixels over the first area 101. That is, when viewed in a direction (e.g. z direction) perpendicular to the upper surface of the substrate 100, the disconnection portion 150 may entirely surround the emission areas.

The disconnection portion 150 may have a structure capable of disconnecting at least a portion of the functional layer (for example, the first functional layer 212a and/or the second functional layer 212c) and/or the second electrode 213. In an embodiment, the edge of the upper surface of the disconnection portion 150 may include a tip PT that more protrudes in a direction away from the center of the disconnection portion 150 than the corresponding edge of the upper surface of the layer on which the disconnection portion 150 is located.

In an embodiment, the disconnection portion 150 including the tip PT may be formed before the process of forming the intermediate layer 212 and the second electrode 213. A functional layer having a relatively poor step coverage, for example, the first functional layer 212a and/or the second functional layer 212c, may be disconnected or separated. The first functional layer 212a and/or the second functional layer 212c may be formed by a thermal deposition, and when the first functional layer 212a and/or the second functional layer 212c is deposited, the first functional layer 212a and/or the second functional layer 212c may be discontinuously formed by the structure of the tip PT of the disconnection portion 150. In such an embodiment, the second electrode 213 may also be formed by thermal deposition and may be formed discontinuously by the disconnection portion 150.

In an embodiment, the first inorganic encapsulation layer 310 and the second inorganic encapsulation layer 330 having a relatively high step coverage may be continuously formed along the shape of the disconnection portion 150.

In an embodiment, as illustrated in FIGS. 5A and 5B, the disconnection portion 150 may be disposed on or located over any one of organic layers disposed on the first electrode 211. In such an embodiment, the disconnection portion 150 may be disposed on or formed over any organic layer, the distance from the upper surface of which to the upper surface of the substrate 100 is greater than the distance from the upper surface of the first electrode 211 to the upper surface of the substrate 100.

FIG. 5A illustrates an embodiment where the organic layer on which the disconnection portion 150 is located is the pixel definition layer 118 or an organic material layer including a same material as and having a same layer structure as the pixel definition layer 118. FIG. 5B illustrates an alternative embodiment where the organic layer on which the disconnection portion 150 is located is an additional organic layer 120 disposed on or located over the pixel definition layer 118 or an organic material layer including a same material as and having a same layer structure as the additional organic layer 120. In such an embodiment, the additional organic layer 120 may function as a spacer and may include the same material and have the same layer structure as the second pattern layer 119b of the dam portion 119.

In such embodiments, the disconnection portion 150 may include a tip PT. In such embodiments, the edge of the upper surface of the disconnection portion 150 may include a tip PT that more protrudes in a direction away from the center of the disconnection portion 150 or the center of the organic layer than the corresponding edge of the upper surface of the organic layer where the disconnection portion 150 is located. The tip PT of the disconnection portion 150 may disconnect (or separate) the second electrode 213 and/or at least a portion of the functional layer (for example, the first functional layer 212a and/or the second functional layer 212c) included in the intermediate layer 212. Accordingly, in such embodiments, at least a portion of the functional layer included in the intermediate layer 212 covering the first area 101 may include a portion disposed on or located over the disconnection portion 150 and disconnected by the tip PT. In such embodiments, the second electrode 213 covering the first area 101 may include a portion disposed on or located over the disconnection portion 150 and disconnected by the tip PT.

In an embodiment, the encapsulation layer 300 may not be disconnected by the disconnection portion 150 and may continuously and entirely cover the first area 101. In such an embodiment, the first inorganic encapsulation layer 310 and the second inorganic encapsulation layer 330 included in the encapsulation layer 300 may have a relatively good step coverage and thus may not be disconnected by the disconnection portion 150 and may extend along the shape of the tip PT while covering the disconnection portion 150. In such an embodiment, the encapsulation layer 300 may continuously cover the upper surface of the second electrode 213, the side surface of the organic layer where the disconnection portion 150 is located, and the side surface of the disconnection portion 150.

The disconnection portion 150 may include an inorganic insulating material such as silicon nitride, silicon oxide, or silicon oxynitride. In an embodiment, the disconnection portion 150, the first inorganic insulating layer PVX1, and/or the second inorganic insulating layer PVX2 may include a same material as each other.

In an alternative embodiment, as illustrated in FIG. 5C, the disconnection portion 150 may have an undercut structure formed by the second inorganic insulating layer PVX2 and the organic insulating layer 115 and 116 located under the first electrode 211. Particularly, the disconnection portion 150 may have an undercut structure formed by the second inorganic insulating layer PVX2 and at least one of the organic insulating layers 115 and 116 arranged between the first inorganic insulating layer PVX1 and the second inorganic insulating layer PVX2.

Referring to FIG. 5C, a first opening h1 may be defined through the second inorganic insulating layer PVX2, a second opening h2 may be defined through the second organic insulating layer 116, and a third opening h3 may be defined through the first organic insulating layer 115. In such an embodiment, the first to third openings h1, h2, and h3 may overlap each other. The edge of the upper surface of the second inorganic insulating layer PVX2 that defines the first opening h1 may form the tip PT of the disconnection portion 150 by more protruding in a direction toward the center of the first opening h1 than the corresponding edge of the upper surface of the second opening h2 and the edge of the upper surface of the third opening h3. In such an embodiment, when viewed in a direction perpendicular to the upper surface of the substrate 100, the area of the first opening h1 may be less than the area of the second opening h2 and the area of the third opening h3, and the inner edge of the first opening h1 may form the tip PT of the disconnection portion 150.

Like the disconnection portion 150 illustrated in FIGS. 5A and 5B, the disconnection portion 150 having an undercut structure illustrated in FIG. 5C may disconnect (or separate) the second electrode 213 and/or at least a portion of the functional layer included in the intermediate layer 212. Accordingly, at least a portion of the functional layer included in the intermediate layer 212 covering the first area 101 may include a portion disconnected by the tip PT and disposed on or located over the upper surface of the first inorganic insulating layer PVX1 exposed by the third opening h3. In such an embodiment, the second electrode 213 covering the first area 101 may include a portion disconnected by the tip PT and disposed on or located over the upper surface of the first inorganic insulating layer PVX1 exposed by the third opening h3.

When viewed in a direction perpendicular to the upper surface of the substrate 100, the disconnection portion 150 having the undercut structure may be formed along the edge of the first area 101 and may entirely surround the emission areas arranged over the first area 101.

Figure 6:
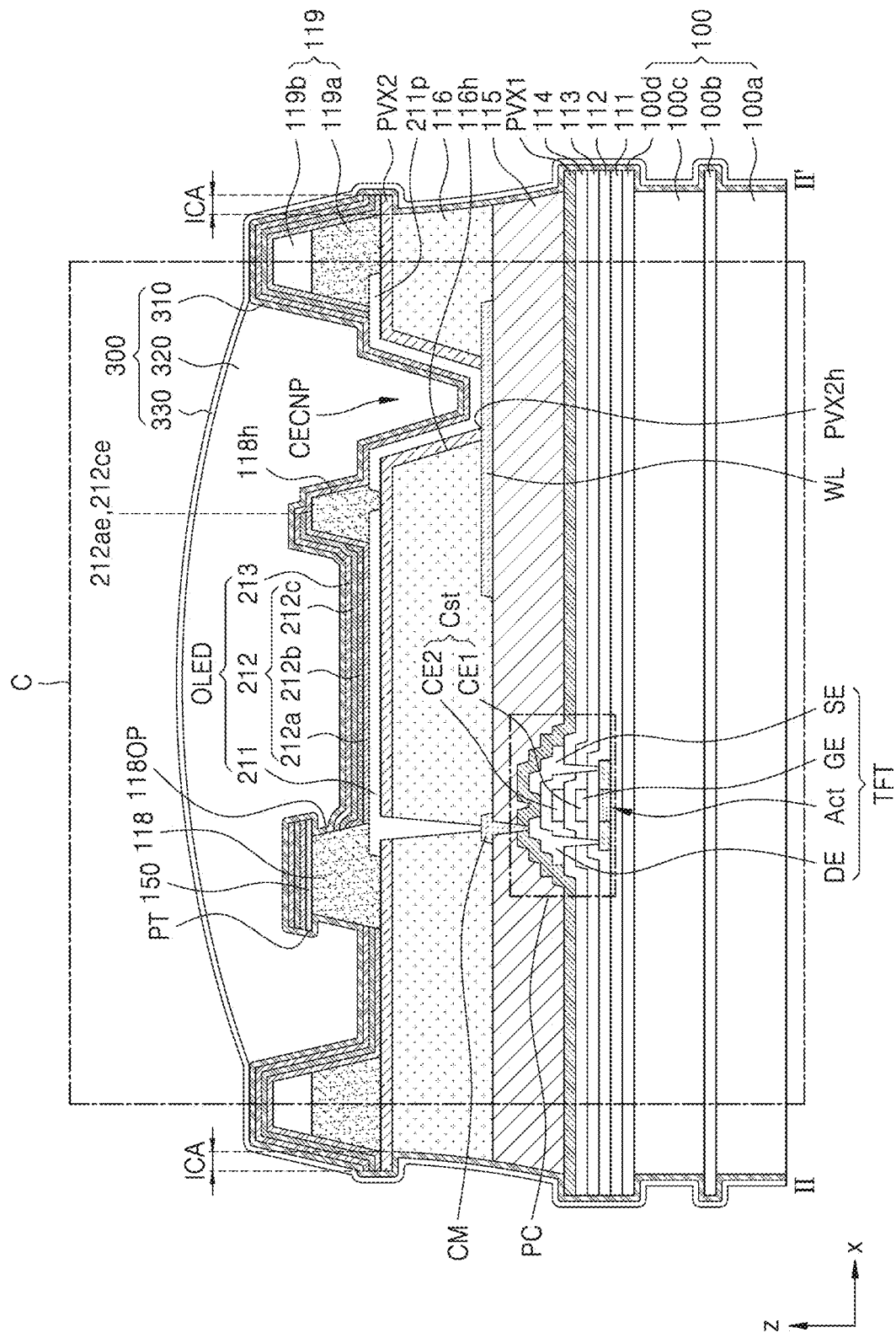
FIG. 6 is a cross-sectional view schematically illustrating a portion of a display apparatus according to an embodiment.

FIG. 6 is a cross-sectional view schematically illustrating a portion of a display apparatus according to an embodiment. FIG. 6 may correspond to a cross-sectional view of the display apparatus taken along line II-II' of FIG. 3.

Referring to FIG. 6, in an embodiment, a power supply line WL and a connection electrode 211p may be disposed on or located over the first area 101.

The power supply line WL may be a line for providing the first power voltage ELVDD (see FIG. 4) or the second power voltage ELVSS described above with reference to FIG. 4. The power supply line WL may be disposed on or located over at least one of the second areas 102 and may extend in a direction toward the first area 101.

The power supply line WL may be electrically connected to the second electrode 213. Referring to FIGS. 3 and 6, in an embodiment, the power supply line WL and the second electrode 213 may be electrically connected in an inner area surrounded by the inorganic contact area ICA, thereby forming a connection portion CECNP. In an embodiment, the power supply line WL may include a same material as and may have a same layer structure as the source electrode SE, the drain electrode DE, and/or the contact metal CM.

In an embodiment, as illustrated in FIG. 6, holes may be defined through the layer arranged between the power supply line WL and the second electrode 213 to form the connection portion CECNP. In one embodiment, for example, a first hole 116h may be defined through the second organic insulating layer 116 to overlap the power supply line WL, a second hole PVX2h may be defined through the second inorganic insulating layer PVX2, and a third hole 118h may be defined through the pixel definition layer 118. The first hole 116h, the second hole PVX2h, and the third hole 118h may overlap each other.

A connection electrode 211p may be disposed on the second inorganic insulating layer PVX2. The power supply line WL and the second electrode 213 may be electrically connected by the connection electrode 211p. In an embodiment, the connection electrode 211p may contact the power supply line WL through the first hole 116h of the second organic insulating layer 116 and the second hole PVX2h of the second inorganic insulating layer PVX2, and the second electrode 213 may contact the connection electrode 211p through the third hole 118h of the pixel definition layer 118. In an embodiment, the connection electrode 211p and the first electrode 211 may include a same material as each other and have a same layer structure as each other.

In an embodiment, the pixel definition layer 118 may cover at least a portion of the connection electrode 211p and at least a portion of the first electrode 211. The second electrode 213 covering the first electrode 211 may cover the connection portion CECNP by extending while covering the pixel definition layer 118. The second electrode 213 may contact the connection electrode 211p at the connection portion CECNP. In an embodiment where the second electrode 213 is continuously formed without disconnection to contact the connection electrode 211p, the disconnection portion 150 described above may not exist over the pixel definition layer 118 covering at least a portion of the connection electrode 211p. In such an embodiment, the disconnection portion 150 may be arranged to entirely surround each of the emission areas of the pixel in the plan view, and may not be arranged over at least a portion of the edge of the emission area. The second electrode 213 may not be disconnected in a portion of the edge of the emission area where the disconnection portion 150 is not arranged, and may extend toward the outside of the emission area to contact the connection portion CECNP or may extend to the inside of another emission area. Accordingly, each of the emission areas may be electrically connected to the connection portion CECNP through a portion of the edge where the disconnection portion 150 is not arranged, or may be electrically connected to another emission area.

In an embodiment, the second electrode 213 extending in a portion of the edge of an emission area, in which the disconnection portion 150 is not arranged, among the emission areas located in the first area 101 (see FIG. 3) may be electrically connected by contacting the connection portion CECNP and may also extend to the inside of the emission area through a portion of the edge of another emission area located in the first area 101, in which the disconnection portion 150 is not arranged. In an alternative embodiment, a plurality of connection portions CECNP are arranged in the first area 101, and the second electrode 213 extending in a portion of the edge of each of the emission areas, in which the disconnection portion 150 is not arranged, may be electrically connected by contacting the adjacent connection portion CECNP. In such an embodiment, the first functional layer 212a and the second functional layer 212c arranged under the second electrode 213 may not cover the connection portion CECNP. In one embodiment, for example, edges 212ae and 212ce of the first and second functional layers 212a and 212c may be spaced apart from the inorganic contact area ICA by a certain distance with the connection portion CECNP therebetween. FIG. 6 illustrates an embodiment where the edges 212ae and 212ce of the first and second functional layers 212a and 212c are formed over the pixel definition layer 118; however, the disclosure is not limited thereto. In one embodiment, for example, the first functional layer 212a and the second functional layer 212c may extend while covering the side surface of the pixel definition layer 118 and may be disconnected over the upper surface of the connection electrode 211p. In such an embodiment, the edges 212ae and 212ce of the first and second functional layers 212a and 212c may be disposed over the upper surface of the connection electrode 211p.

FIGS. 7 to 12 are cross-sectional views sequentially illustrating a process of manufacturing region A of the display apparatus of FIG. 5A. Hereinafter, a process of an embodiment of a method of manufacturing the display apparatus of FIG. 5A will be mainly described with reference to FIGS. 7 to 12, and any repetitive detailed descriptions of the same or like elements as those described above will be omitted for conciseness.

Figure 7:
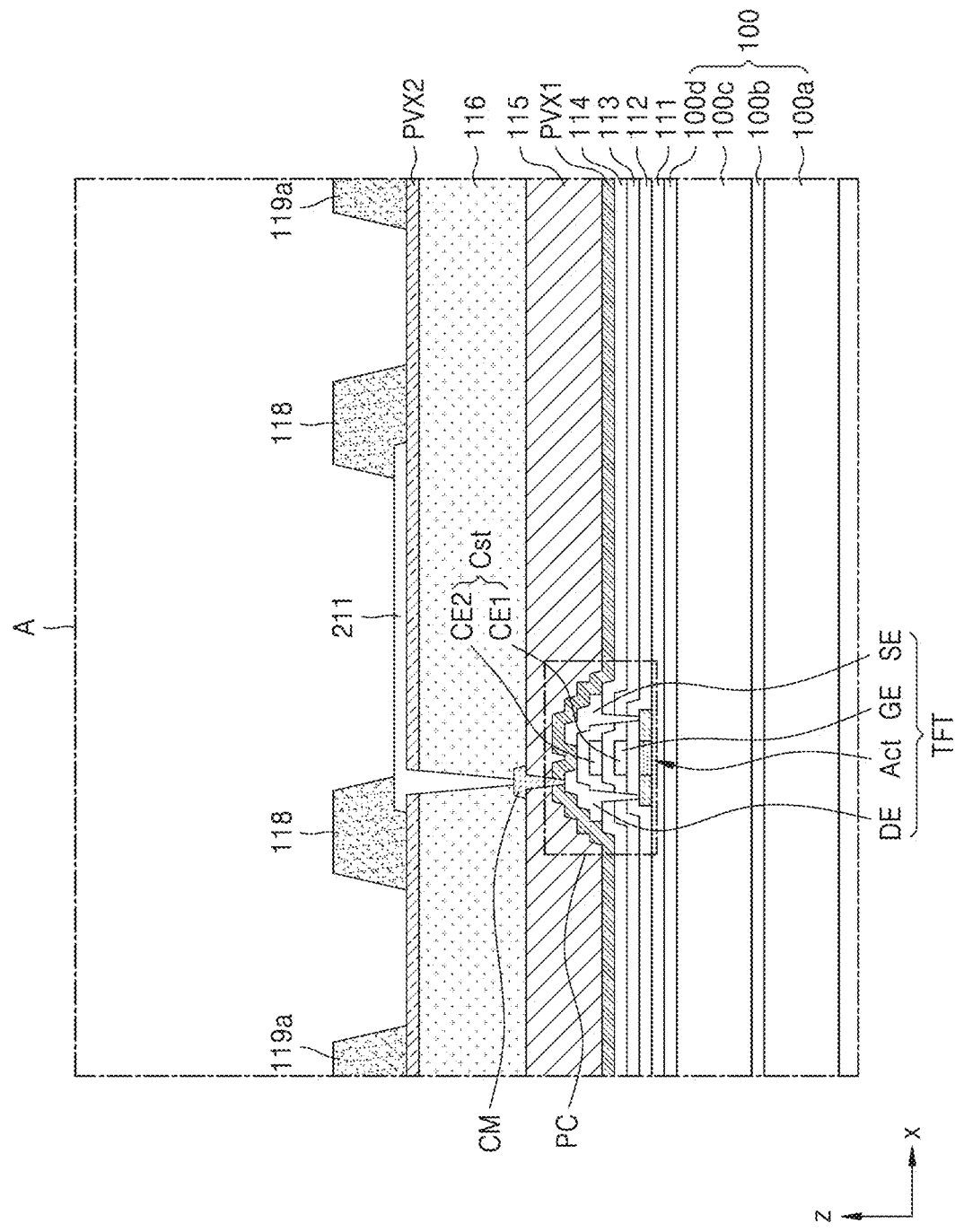
FIGS. 7 to 12 are cross-sectional views sequentially illustrating a portion of a method of manufacturing a display apparatus according to an embodiment.

In an embodiment, as illustrated in FIG. 7, a pixel circuit PC and a first electrode 211 electrically connected to the pixel circuit PC may be provided or formed over a first area 101 of a substrate 100. Subsequently, an organic material layer may be formed on the pixel circuit PC and the first electrode 211 to cover the first area 101, and the organic material layer may be patterned to form an organic layer. In such an embodiment, the organic layer may be extend or located along the edge of the first area 101 such that the first electrode 211 may be located in the inside thereof, and the distance from the upper surface thereof to the upper surface of the substrate 100 may be greater than the distance from the upper surface of the first electrode 211 to the upper surface of the substrate 100. In an embodiment, the organic layer formed in FIG. 7 may include a pixel definition layer 118 and a first pattern layer 119a. In such an embodiment, the pixel definition layer 118 and the organic layer where a disconnection portion 150 is located may be simultaneously formed with each other.

Figure 8:
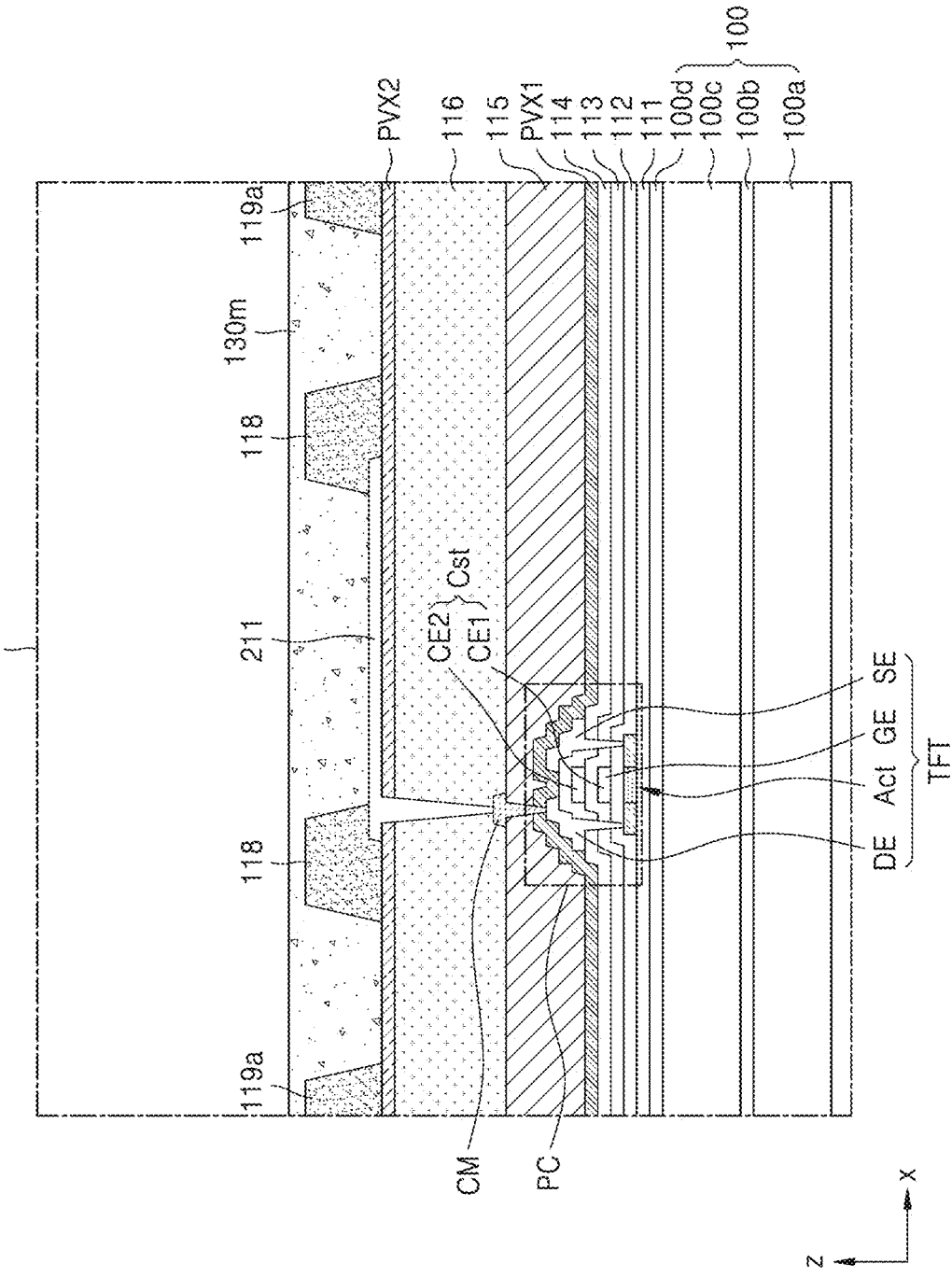
Figure 9:
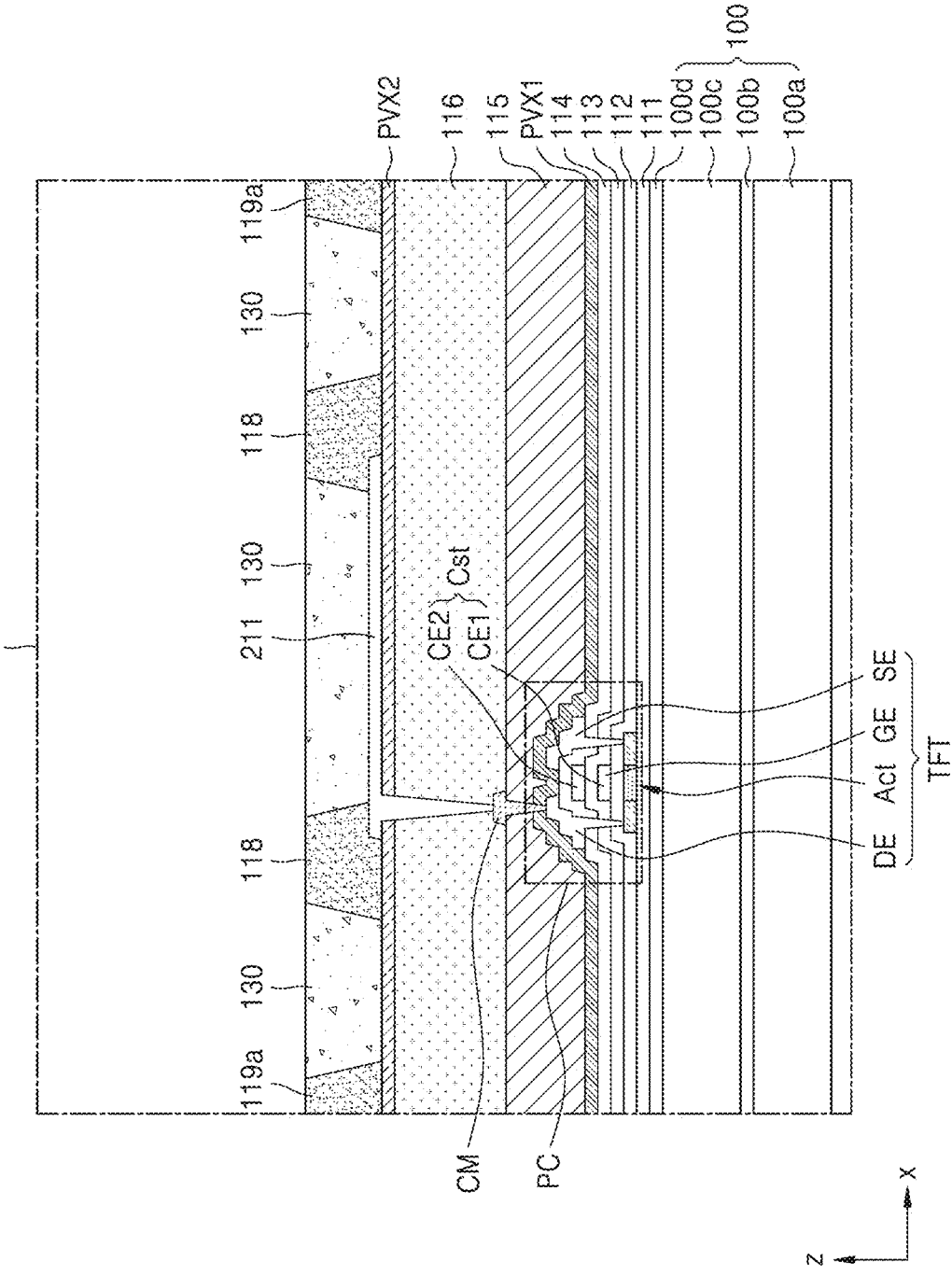

Subsequently, as illustrated in FIGS. 8 and 9, a sacrificial material layer 130m may be formed on the organic layer to cover the first area 101, and the sacrificial material layer 130m may be patterned to form a sacrificial layer 130.

The sacrificial material layer 130m may be a layer for forming the sacrificial layer 130 and may entirely cover the organic layer formed in FIG. 7. In an embodiment, the sacrificial material layer 130m may entirely cover the pixel definition layer 118 and the first pattern layer 119a. The sacrificial material layer 130m may be patterned through a mask process. Here, the mask may refer to a mask assembly including a frame with one or more openings (open areas) and a mask with one or more openings formed along a pattern.

The sacrificial layer 130 may be a layer provided in the manufacturing process to form the structure of the tip PT (see FIG. 5A) of the disconnection portion 150 (see FIG. 5A). The sacrificial layer 130 may be provided to expose at least a portion of the upper surface of an organic layer formed in FIG. 7 and fill the openings of the organic layer. In an embodiment, the sacrificial layer 130 may be arranged between the pixel definition layers 118 and between the pixel definition layer 118 and the first pattern layer 119a.

Figure 10:
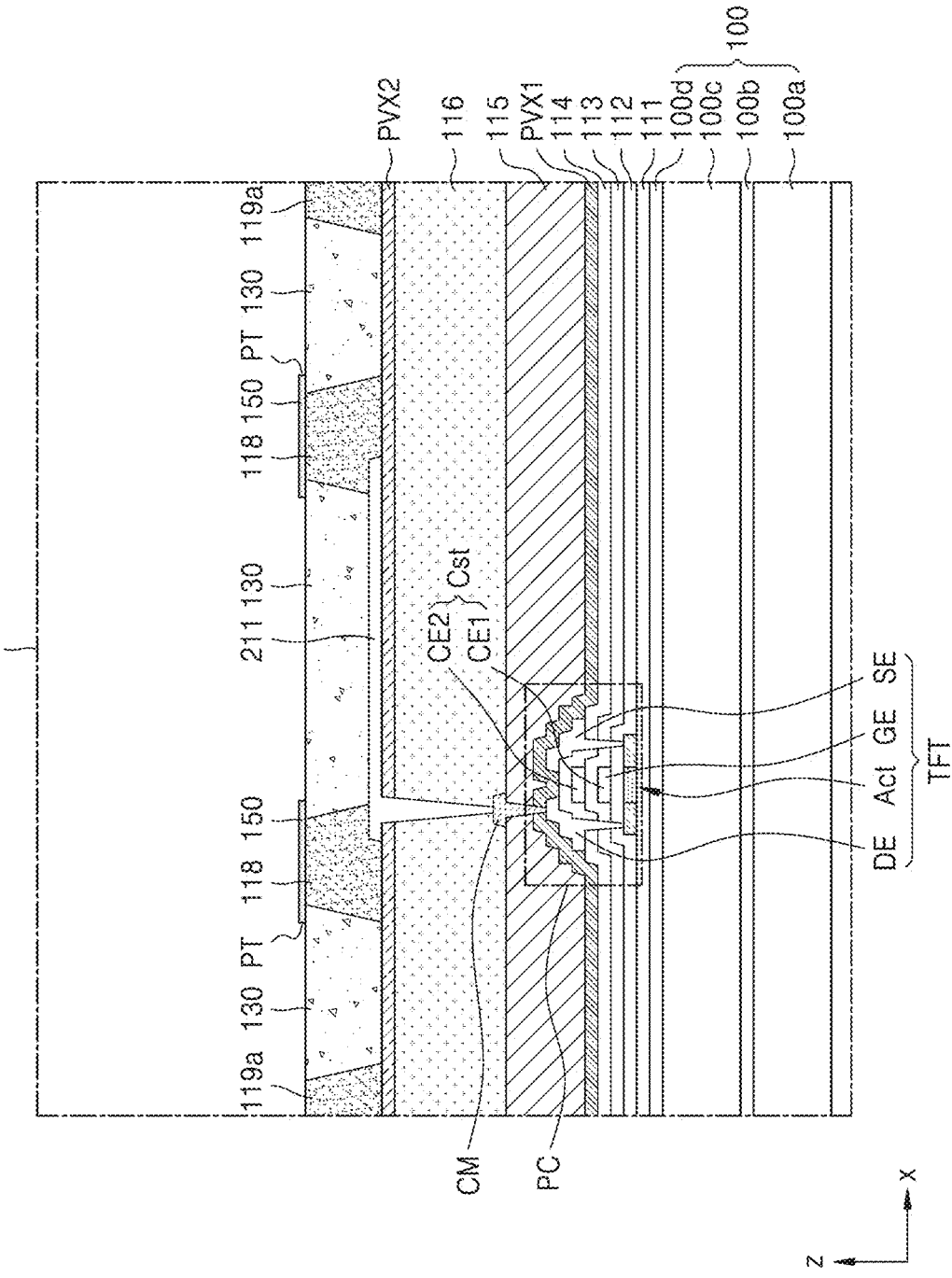

Subsequently, as illustrated in FIG. 10, an inorganic material layer may be formed on the sacrificial layer 130 to cover the first area 101, and the inorganic material layer may be patterned to form a disconnection portion 150. The disconnection portion 150 may be disposed on or located over the pixel definition layer 118 included in the organic layer formed in FIG. 7 and may include a tip PT the edge of the upper surface of which more protrudes in a direction away from the center of the pixel definition layer 118 or the center of the disconnection portion 150 than the corresponding edge of the upper surface of the pixel definition layer 118.

The disconnection portion 150 may include a portion covering the upper surface of the pixel definition layer 118 and a portion extending in a direction away from the center of the pixel definition layer 118 to cover the adjacent sacrificial layer 130. In such an embodiment, the tip PT may be formed at a portion of the disconnection portion 150 that covers the sacrificial layer 130. The shape of the disconnection portion 150 may depend on the shape of the sacrificial layer 130 and the pixel definition layer 118 covered by the disconnection portion 150, which will be described later in greater detail with reference to FIGS. 13A to 13C.

Figure 11:
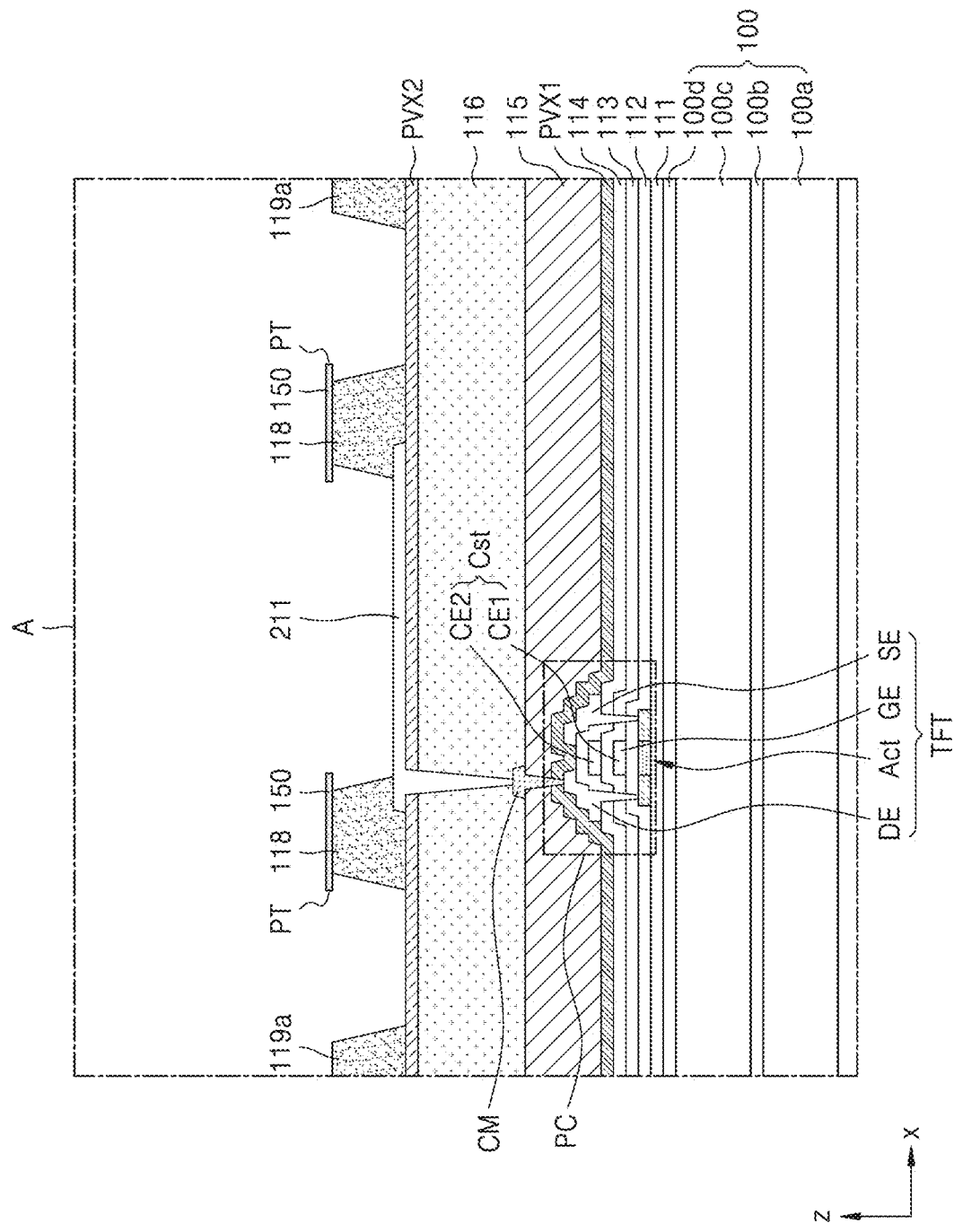

Subsequently, as illustrated in FIG. 11, the sacrificial layer 130 may be removed. The sacrificial layer 130 may not exist in the final product because the sacrificial layer 130 is removed after the disconnection portion 150 is formed. Even when the sacrificial layer 130 is removed, the shape of the disconnection portion 150 already formed may be maintained without being deformed.

In an embodiment, the sacrificial layer 130 may be removed through a strip process or an ashing process, however, the disclosure is not limited thereto. In an embodiment, the sacrificial layer 130 may include a photoresist material that causes a chemical change when irradiated with light. In one embodiment, for example, the sacrificial layer 130 may include a negative photoresist such as aromatic bis-azide, methacrylic acid ester, or cinnamic acid ester or may include a positive photoresist such as polymethyl methacrylate, naphthquinone diazide, or polybutene-1-sulfone; however, the disclosure is not limited thereto.

Figure 12:
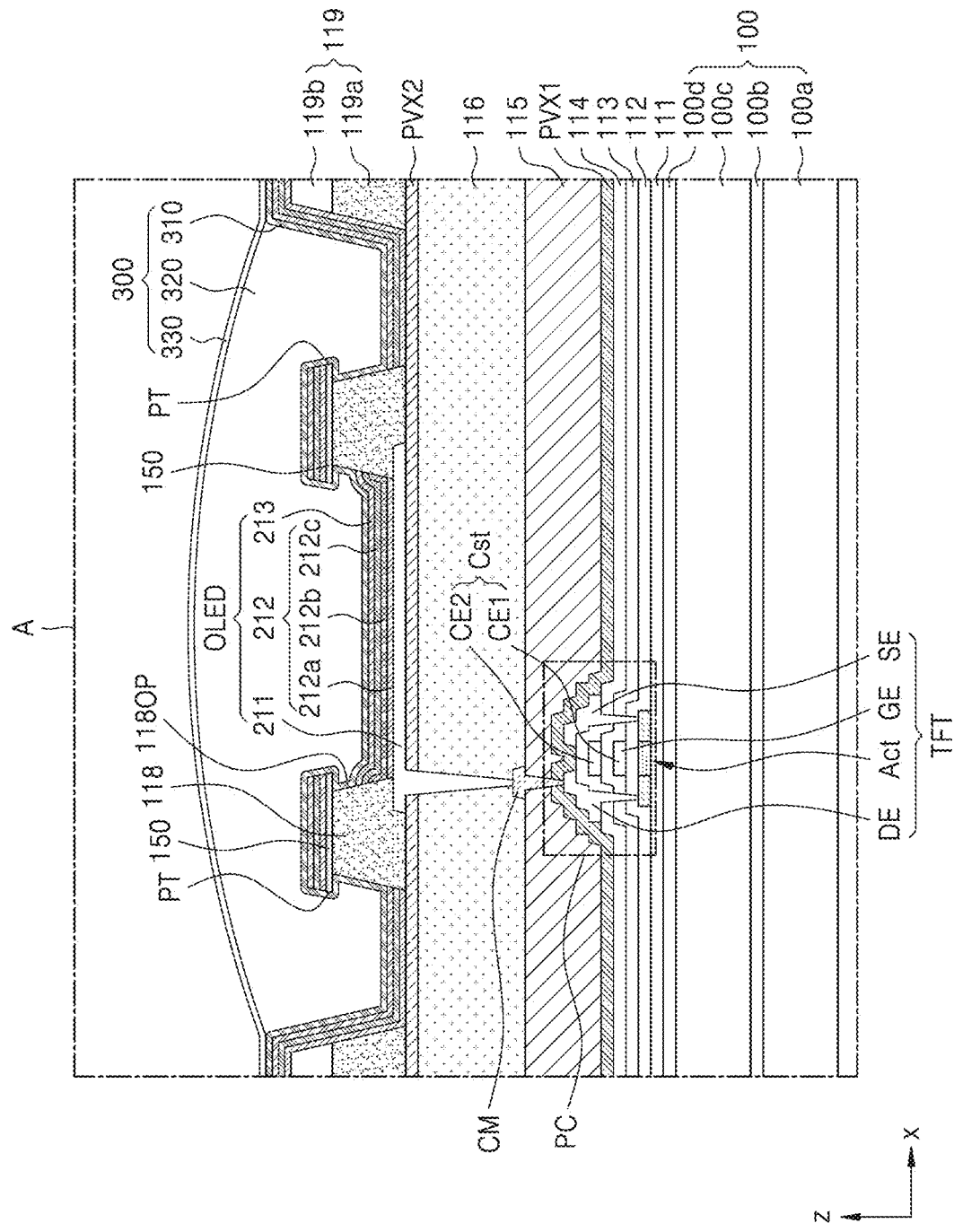

Subsequently, as illustrated in FIG. 12, an intermediate layer 212, a second electrode 213, and an encapsulation layer 300 may be sequentially provided or formed over the resulting structure of FIG. 11. In such an embodiment, as described above, the second electrode 213 and/or at least a portion of the functional layer included in the intermediate layer 212 may be disconnected by the disconnection portion 150. In such an embodiment, the encapsulation layer 300 may not be disconnected by the disconnection portion 150 and may continuously cover the first area 101 and encapsulate the components inside the first area 101.

Although FIGS. 7 to 12 illustrate an embodiment where the disconnection portion 150 is disposed on the pixel definition layer 118 as in FIG. 5A, but not being limited thereto. Alternatively, an embodiment of FIG. 5B may be manufactured using the organic layer formed in FIG. 7 using the process described above. In such an embodiment, an embodiment of the display apparatus illustrated in FIG. 5B may be manufactured by forming the pixel definition layer 118 in the process operation of FIG. 7, forming the additional organic layer 120 (see FIG. 5B) disposed on or located over the pixel definition layer 118, and then performing the process of FIGS. 8 to 12 in a same manner. In such an embodiment, the disconnection portion 150 may be disposed on or located over the additional organic layer 120. in such an embodiment, the second pattern layer 119b and the additional organic layer 120 where the disconnection portion 150 is located may be simultaneously formed with each other.

Figure 13A:
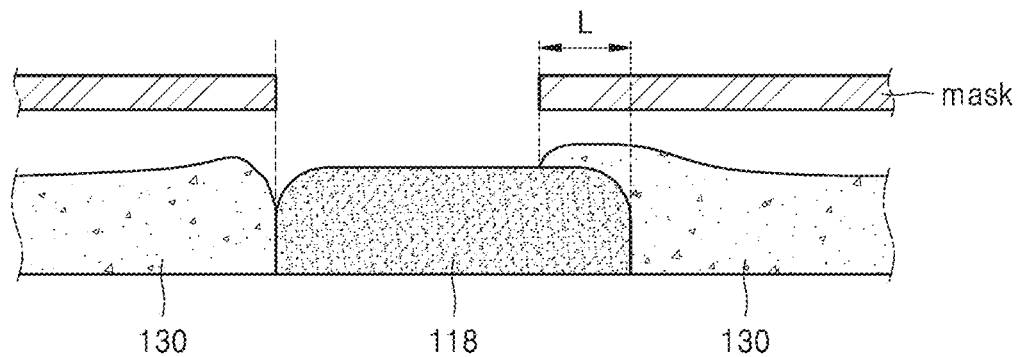
FIGS. 13A to 13C are cross-sectional views sequentially illustrating a process of forming a disconnection portion according to an embodiment.
Figure 13B:
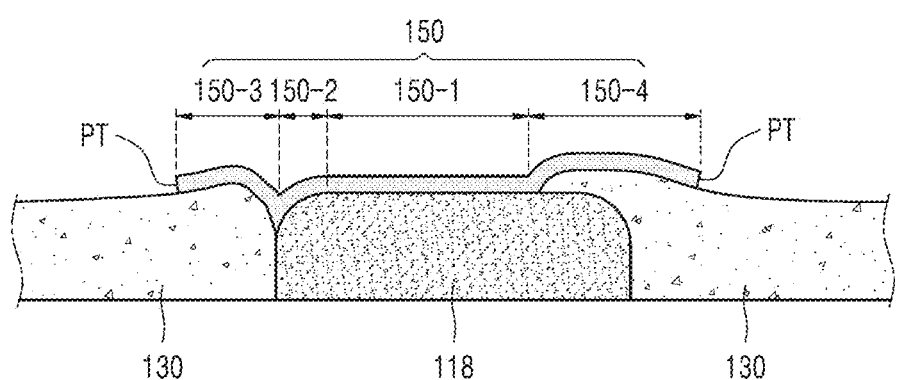
Figure 13C:
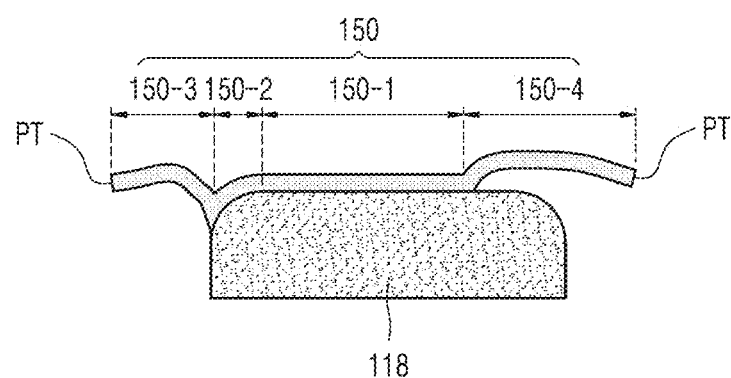

FIGS. 13A to 13C are cross-sectional views sequentially illustrating a process of forming the disconnection portion 150 according to an embodiment. For reference, in FIGS. 13A to 13C, components other than the pixel definition layer 118 and the sacrificial layer 130 are omitted for convenience of illustration.

In an embodiment, the shape of the disconnection portion 150 may depend on the shape of the sacrificial layer 130 and the pixel definition layer 118 covered by the disconnection portion 150, and the shape of the sacrificial layer 130 may depend on the alignment position of the mask.

As illustrated in 13A, in the mask process of forming the sacrificial layer 130 by patterning the sacrificial material layer 130m (see FIG. 8), the mask may be arranged over the substrate 100. In the mask, an opening is defined to correspond to the pattern of the sacrificial layer 130. In an embodiment, when the sacrificial material layer 130m includes a positive photoresist, the opening of the mask may be disposed to overlap an area where the sacrificial material layer 130m is to be removed.

In an embodiment, as illustrated in the left side of FIG. 13A, when the mask is arranged over the substrate 100, the edge of the opening of the mask may be aligned to match the edge of the pixel definition layer 118. When a patterning process is performed by aligning the masks as such, the sacrificial layer 130 may be formed only in an area that does not overlap the pixel definition layer 118.

Subsequently, when an inorganic material layer is formed to cover the pixel definition layer 118 and the sacrificial layer 130 and then patterned to form the disconnection portion 150, the disconnection portion 150 may have a shape illustrated in the left side of FIG. 13B. Particularly, the disconnection portion 150 may include a first portion 150-1, a second portion 150-2, and a third portion 150-3. The first portion 150-1 may cover at least a portion of the upper surface of the pixel definition layer 118, the shape of the lower surface of which may be substantially the same as the shape of a corresponding portion (e.g., an overlapping portion) of the upper surface of the pixel definition layer 118. The second portion 150-2 may extend from the end of the first portion 150-1 to the edge of the pixel definition layer 118, the shape of the lower surface of which may be substantially the same as the shape of a corresponding portion of the upper surface of the pixel definition layer 118. The third portion 150-3 may be a portion extending from the end of the second portion 150-2 in a direction away from the pixel definition layer 118. In an alternative embodiment, the shape of the lower surface of the third portion 150-3 may be different from the shape of a corresponding portion of the upper surface of the pixel definition layer 118 that overlaps the third portion 150-3. In another alternative embodiment, at least a portion of the second portion 150-2 and/or at least a portion of the third portion 150-3 may have a curved shape. In another alternative embodiment, the disconnection portion 150 may have a cusp at a point where the second portion 150-2 and the third portion 150-3 meet each other.

In an alternative embodiment, as illustrated in the right side of FIG. 13A, when the mask is arranged over the substrate 100, the edge of the opening of the mask may be aligned to be closer to the center of the pixel definition layer 118 by a preset distance L than the corresponding edge of the pixel definition layer 118. When a patterning process is performed by aligning the masks as such, at least a portion of the sacrificial layer 130 may overlap the pixel definition layer 118.

Subsequently, when an inorganic material layer is formed to cover the pixel definition layer 118 and the sacrificial layer 130 and then patterned to form the disconnection portion 150, the disconnection portion 150 may have the shape illustrated in the right side of FIG. 13B. Particularly, the disconnection portion 150 may include a first portion 150-1 and a fourth portion 150-4. The first portion 150-1 may cover at least a portion of the upper surface of the pixel definition layer 118, the shape of the lower surface of which may be substantially the same as the shape of a corresponding portion of the upper surface of the pixel definition layer 118. The fourth portion 150-4 may extend from the end of the first portion 150-1 in a direction away from the pixel definition layer 118, the lower surface of which may be spaced apart from the upper surface of the pixel definition layer 118. In an alternative embodiment, the shape of the lower surface of the fourth portion 150-4 may be different from the shape of a corresponding portion of the upper surface of the pixel definition layer 118. In another alternative embodiment, at least a portion of the fourth portion 150-4 may have a curve. In another alternative embodiment, the disconnection portion 150 may not have a cusp at a point where the first portion 150-1 and the fourth portion 150-4 meet each other. In such embodiments, the structural stability of the disconnection portion 150 may be improved compared to a case where the disconnection portion 150 has a cusp.

In an alternative embodiment, where the disconnection portion 150 is arranged over the additional organic layer 120 disposed on or located over the pixel definition layer 118 as in FIG. 5B, the shape of the disconnection portion 150 may be substantially the same as the shape of the disconnection portion 150 described above with reference to FIGS. 13A to 13C.

In one embodiment, for example, the disconnection portion 150 may include a first portion 150-1 which covers at least a portion of the upper surface of the additional organic layer 120 and the shape of the lower surface of which is substantially the same as the shape of a corresponding portion of the upper surface of the additional organic layer 120, a second portion 150-2 which extends from the end of the first portion 150-1 to the edge of the additional organic layer 120 and the shape of the lower surface of which is substantially the same as the shape of a corresponding portion of the upper surface of the additional organic layer 120, and a third portion 150-3 which extends from the end of the second portion 150-2 in a direction away from the additional organic layer 120.

In one alternative embodiment, for example, the disconnection portion 150 may include a first portion 150-1 which covers at least a portion of the upper surface of the additional organic layer 120 and the shape of the lower surface of which is substantially the same as the shape of a corresponding portion of the upper surface of the additional organic layer 120 and a fourth portion 150-4 which extends from the end of the first portion 150-1 in a direction away from the additional organic layer 120 and the lower surface of which is spaced apart from the upper surface of the additional organic layer 120.

Figure 14:
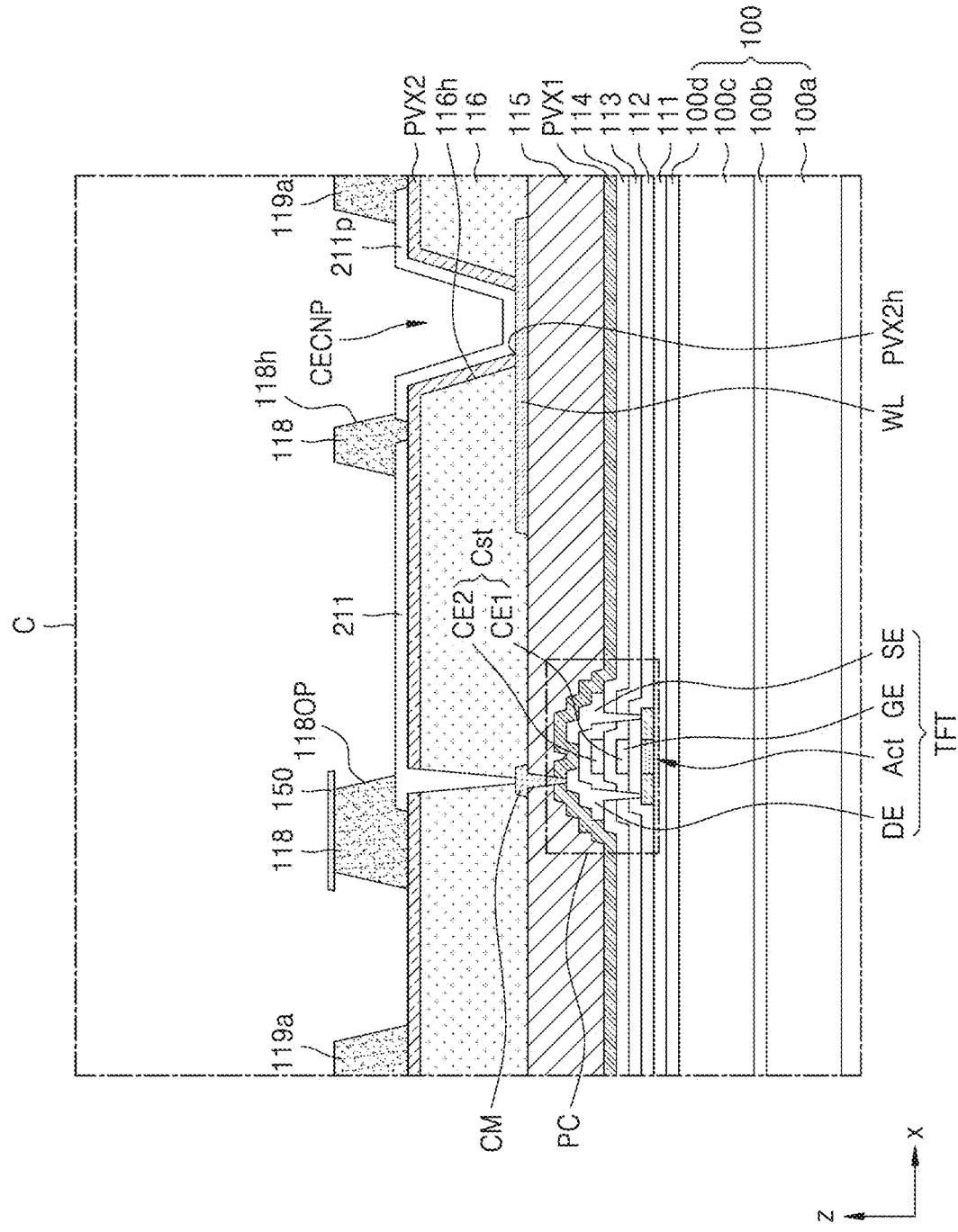
FIGS. 14 to 16 are cross-sectional views sequentially illustrating a portion of a method of manufacturing a display apparatus according to an embodiment.
Figure 15:
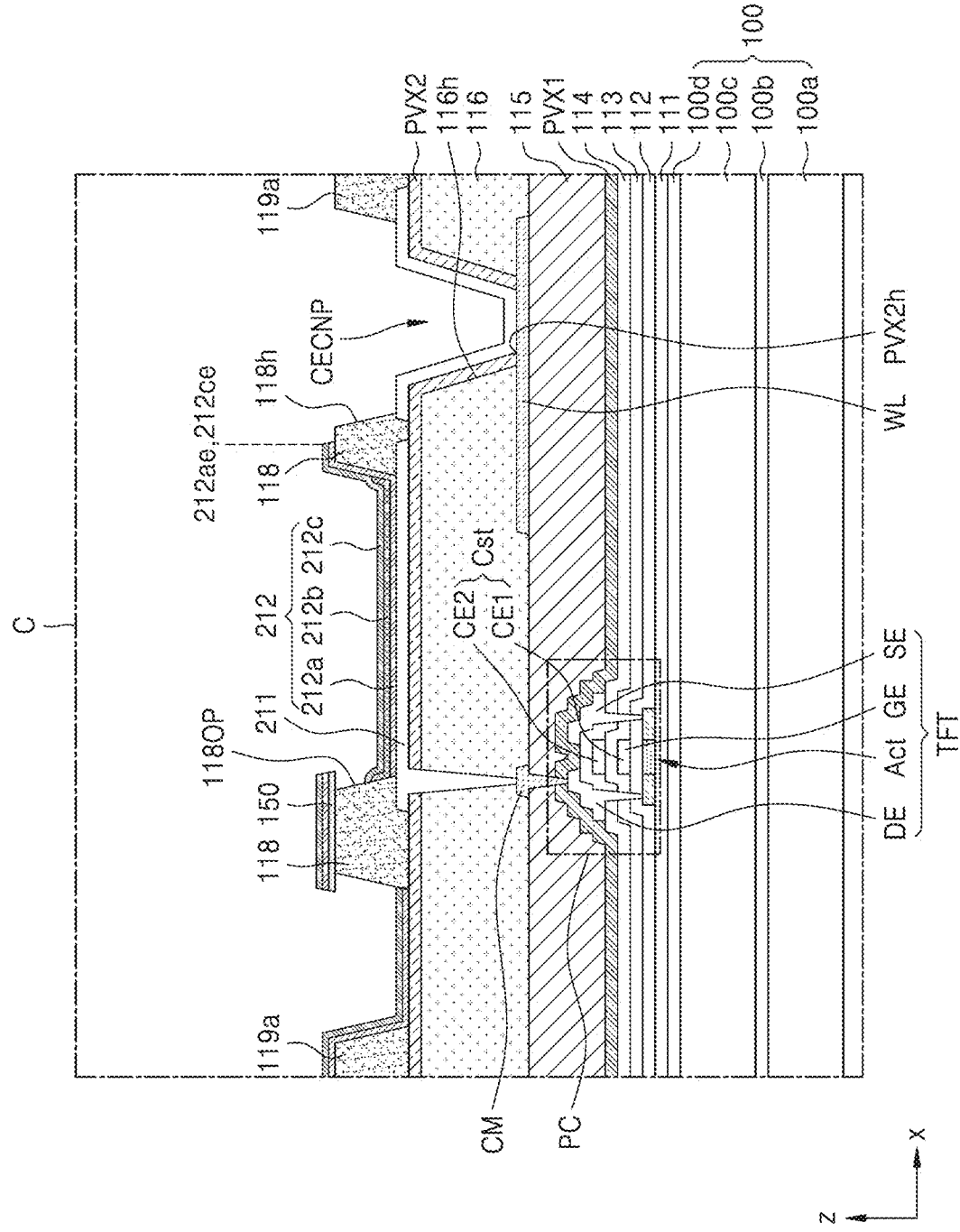
Figure 16:
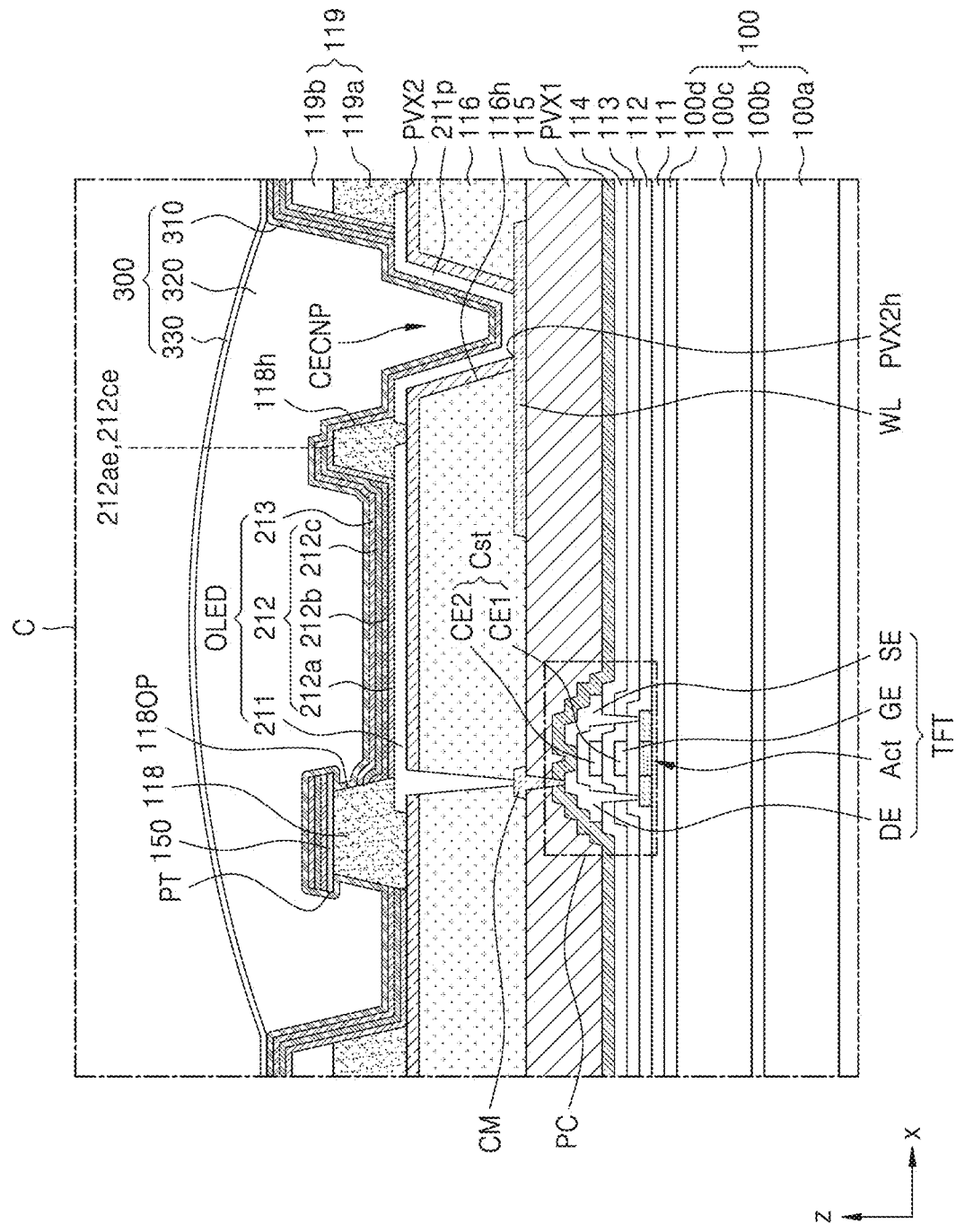

FIGS. 14 to 16 are cross-sectional views sequentially illustrating a process of manufacturing region C of the display apparatus of FIG. 6. Hereinafter, a process of a method of manufacturing the display apparatus of FIG. 6 will be mainly described with reference to FIGS. 14 to 16, and any repetitive detailed descriptions of the same or like elements as those described above will be omitted for conciseness.

As illustrated in FIG. 14, the process described above with reference to FIGS. 7 to 11 may be performed in an area where the connection portion CECNP is provided on the first area 101. In such an embodiment, a power supply line WL and a connection electrode 211p may be further formed in an area where the connection portion CECNP is formed. In an embodiment, the power supply line WL may be simultaneously formed in a same process as the source electrode SE, the drain electrode DE, and/or the contact metal CM, and the connection electrode 211p may be simultaneously formed in a same process as the first electrode 211.

Subsequently, as illustrated in FIG. 15, an intermediate layer 212 may be provided or formed on the first area 101. In an embodiment, the intermediate layer 212 may be patterned by using a mask process. In such an embodiment, the functional layers included in the intermediate layer 212, for example, the first functional layer 212a and the second functional layer 212c, may be formed not to cover the connection portion CECNP. In one embodiment, for example, edges 212ae and 212ce of the first and second functional layers 212a and 212c may be spaced apart from the inorganic contact area ICA by a certain distance with the connection portion CECNP therebetween.

Subsequently, as illustrated in FIG. 16, a second electrode 213 and an encapsulation layer 300 may be sequentially provided or formed on the structure of FIG. 15. In such an embodiment, as described above, the second electrode 213 may be disconnected by the disconnection portion 150. In such an embodiment, the encapsulation layer 300 may not be disconnected by the disconnection portion 150 and may continuously cover the first area 101 and encapsulate the components inside the first area 101.

FIGS. 17 to 21 are cross-sectional views sequentially illustrating a portion of a method of manufacturing a display apparatus according to an alternative embodiment.

FIGS. 17 to 21 are cross-sectional views sequentially illustrating a process of manufacturing region B of the display apparatus of FIG. 5C. Hereinafter, the characteristics of a process of manufacturing the display apparatus of FIG. 5C will be mainly described with reference to FIGS. 17 to 21, and any repetitive detailed descriptions of the same or like elements as those described above will be omitted for conciseness.

Figure 17:
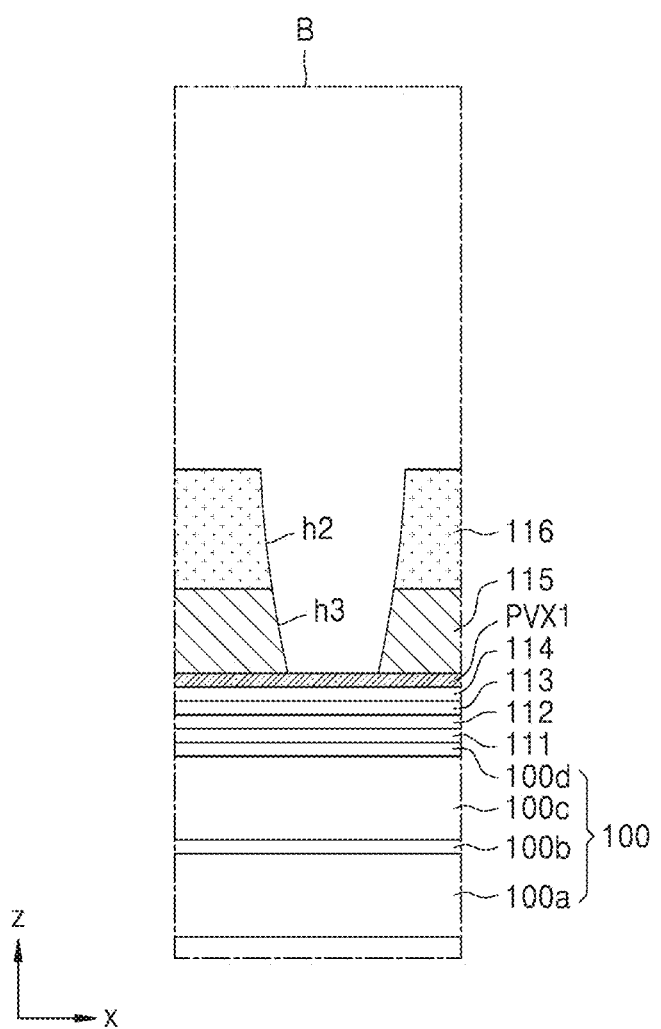
FIGS. 17 to 21 are cross-sectional views sequentially illustrating a portion of a method of manufacturing a display apparatus according to an alternative embodiment.

As illustrated in FIG. 17, The buffer layer 111 and insulating layers 112, 113, 114, PVX1, 115, and 116 may be provided or formed over a first area 101 of a substrate 100, and a patterning process may be performed to form a third opening h3 of a first organic insulating layer 115 and a second opening h2 of a second organic insulating layer 116. Although not illustrated in FIG. 17, a pixel circuit PC may be formed during such a process.

Figure 18:
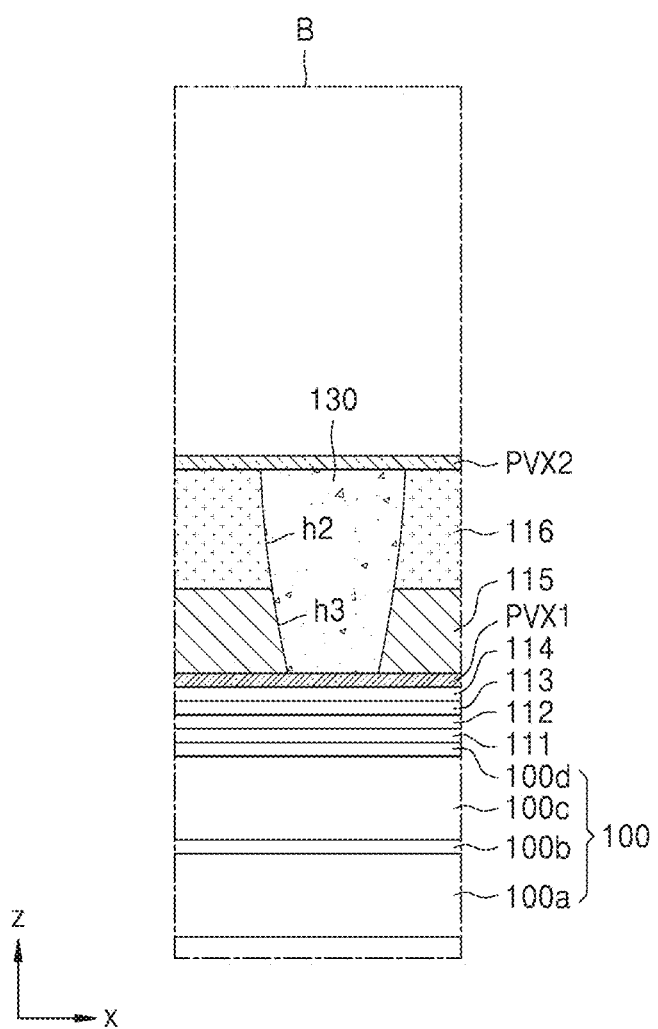

Subsequently, as illustrated in FIG. 18, a sacrificial layer 130 and a second inorganic insulating layer PVX2 may be formed. The sacrificial layer 130 may be formed through the process described above with reference to FIGS. 8 and 9. The sacrificial layer 130 may fill the third opening h3 of the first organic insulating layer 115 and the second opening h2 of the second organic insulating layer 116. The second inorganic insulating layer PVX2 may cover the upper surface of the sacrificial layer 130 and the upper surface of the second organic insulating layer 116.

Figure 19:
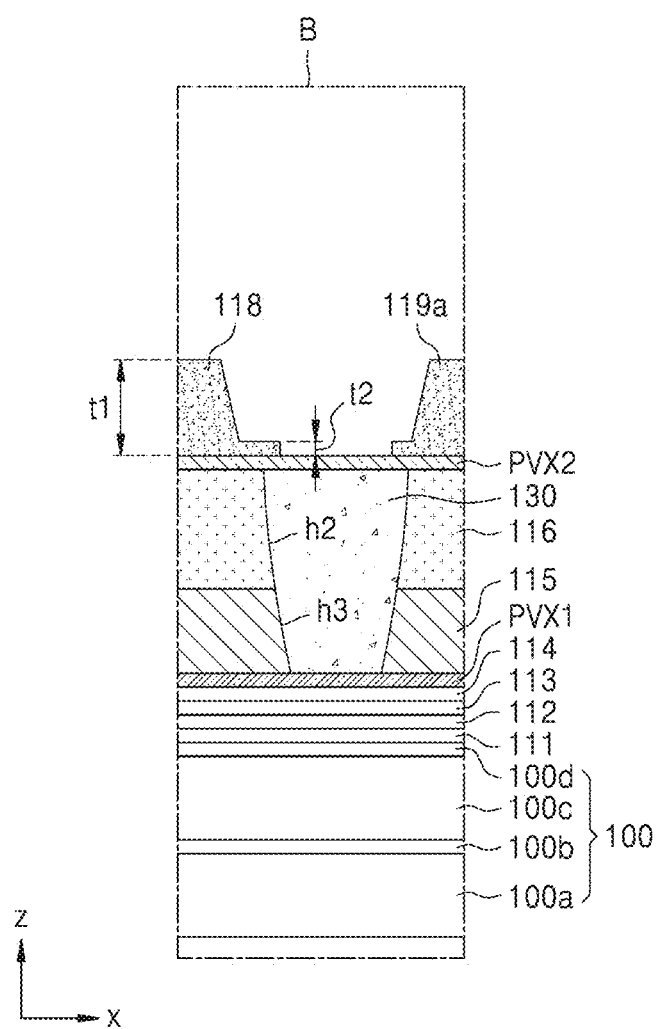
Figure 20:
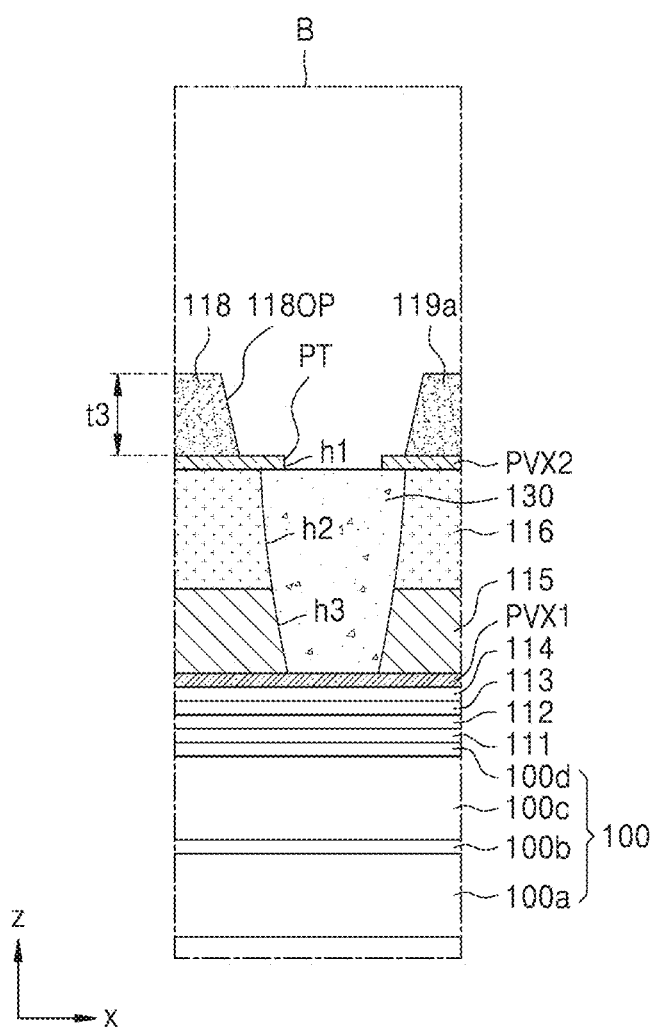

Subsequently, as illustrated in FIGS. 19 and 20, an organic material layer may be formed over the second inorganic insulating layer PVX2, and the organic material layer may be patterned to form a pixel definition layer 118 and a first pattern layer 119a. In an embodiment, each of the pixel definition layer 118 and the first pattern layer 119a may have a different thickness in each portion. In such an embodiment, each of the pixel definition layer 118 and the first pattern layer 119a may have a first thickness area with a first thickness t1 and a second thickness area with a second thickness t2. In an embodiment, a half-tone mask process may be used. Here, the half-tone mask may refer to a mask including a transparent area, a semi-transparent area, and a non-transparent area.

The second inorganic insulating layer PVX2 may be patterned to form a first opening h1. In an embodiment, the pixel definition layer 118 and the first pattern layer 119a may function as a mask in the process of patterning the second inorganic insulating layer PVX2. The second inorganic insulating layer PVX2 may be removed only in an area that does not overlap the pixel definition layer 118 or the first pattern layer 119a, and may not be removed in an area that overlaps the pixel definition layer 118 or the first pattern layer 119a. In an embodiment, the second thickness t2 of the second thickness area may be a thickness of a portion at which the pixel definition layer 118 and the first pattern layer 119a are removed in the process of patterning the second inorganic insulating layer PVX2. Accordingly, when a process of patterning the second inorganic insulating layer PVX2 is performed, the second thickness area of each of the pixel definition layer 118 and the first pattern layer 119a may be removed and the thickness of the first thickness area may be reduced by the second thickness t2 to have a third thickness t3.

In an embodiment where the pixel definition layer 118 and the first pattern layer 119a are used as a mask in the process of patterning the second inorganic insulating layer PVX2, the process efficiency may be improved by not performing a separate mask process to pattern the second inorganic insulating layer PVX2. In such an embodiment, because the second inorganic insulating layer PVX2 may be patterned to form a tip PT of a disconnection portion 150 before the sacrificial layer 130 is completely cured, the sacrificial layer 130 may be easily removed in a subsequent process.

Figure 21:
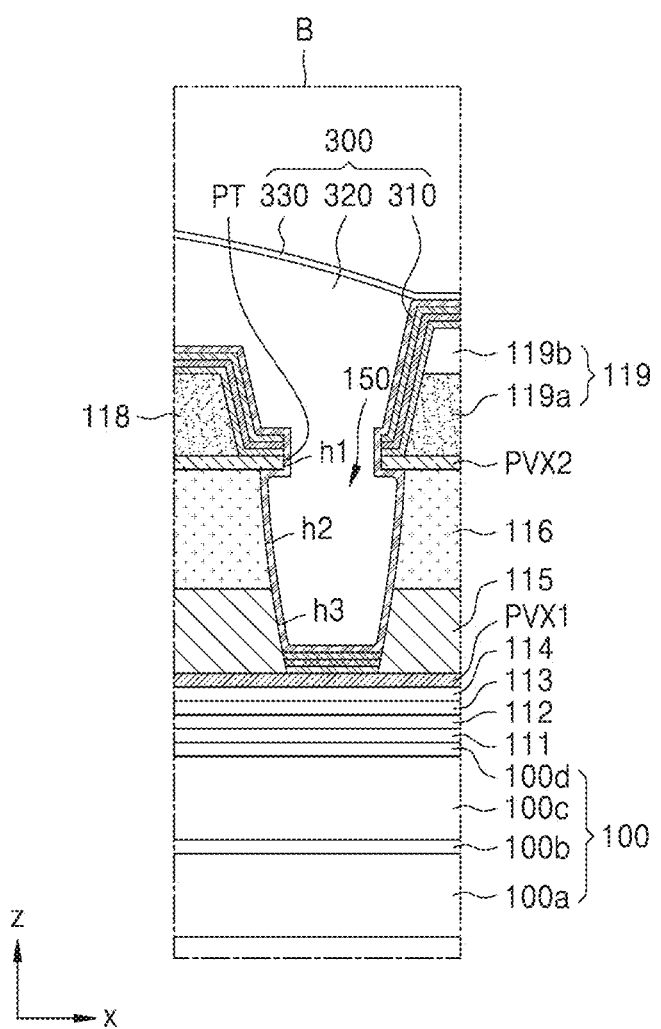

Subsequently, as illustrated in FIG. 21, the sacrificial layer 130 may be removed from the structure of FIG. 20 to form a disconnection portion 150. After the sacrificial layer 130 is removed, an intermediate layer 212, a second electrode 213, and an encapsulation layer 300 may be sequentially formed. In an embodiment, as described above, the second electrode 213 and/or at least a portion of the functional layer included in the intermediate layer 212 may be disconnected by the tip PT of the disconnection portion 150. In such an embodiment, the encapsulation layer 300 may not be disconnected by the disconnection portion 150 and may continuously cover the first area 101 and encapsulate the components inside the first area 101.

Figure 22:
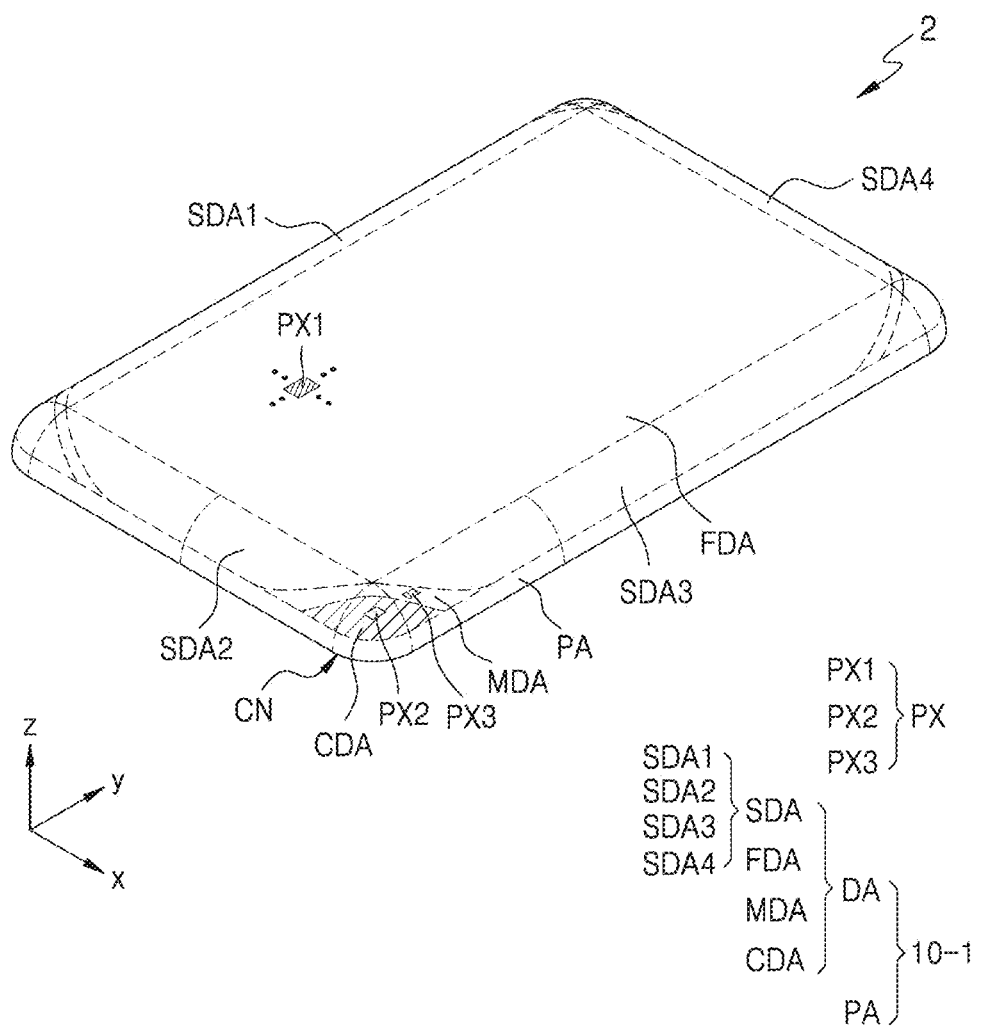
FIG. 22 is a perspective view schematically illustrating a display apparatus according to an embodiment.
Figure 23A:
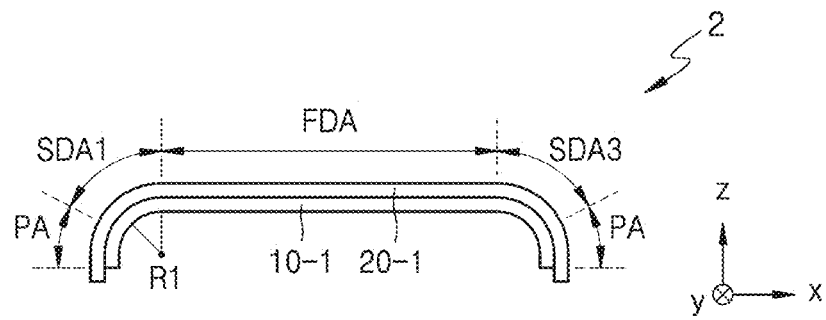
FIGS. 23A to 23C are cross-sectional views schematically illustrating a portion of the display apparatus of FIG. 22.
Figure 23B:
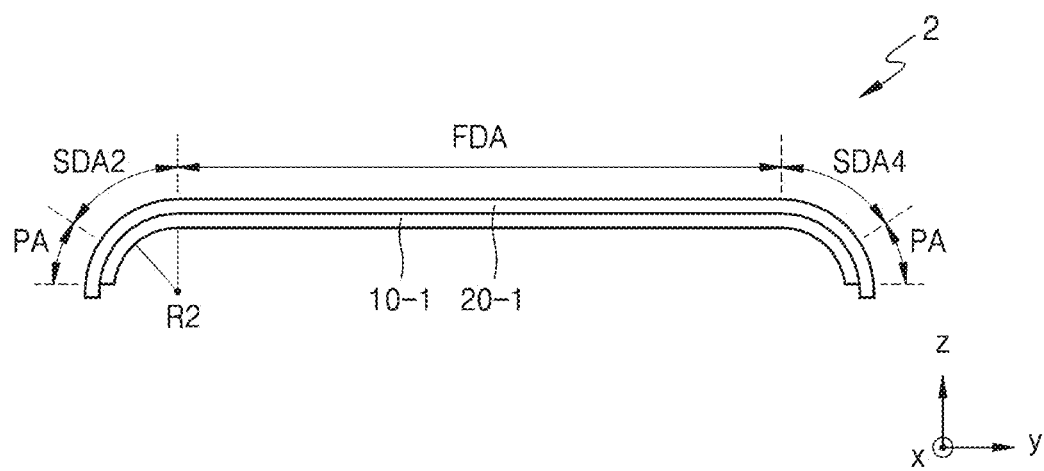
Figure 23C:
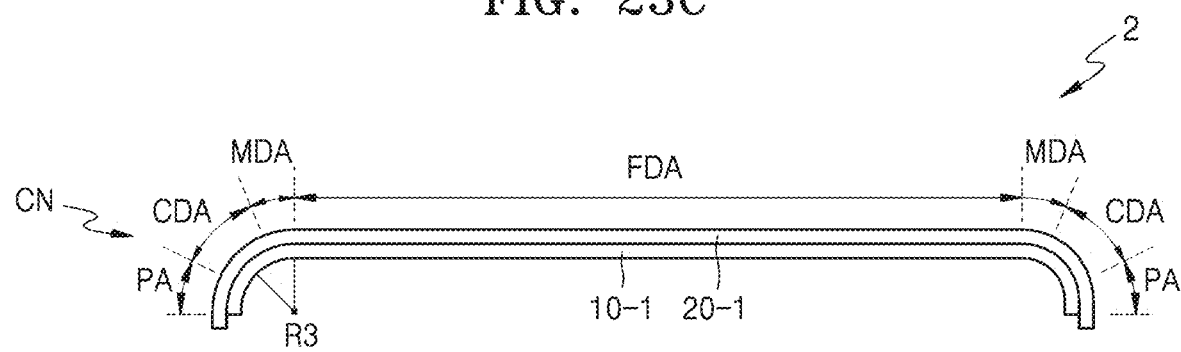
Figure 24:
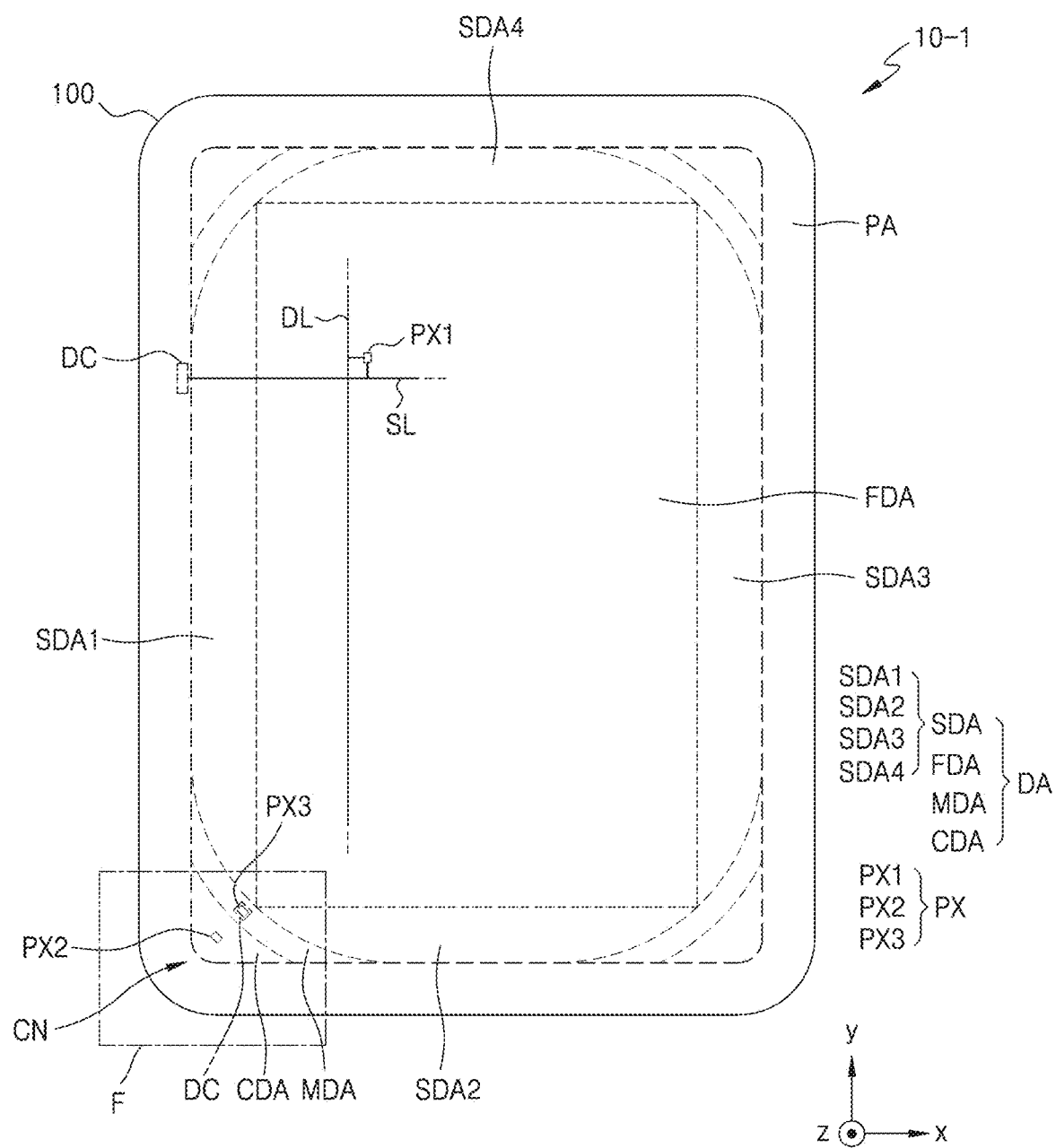
FIG. 24 is a plan view schematically illustrating a display panel included in the display apparatus of FIG. 22.

FIG. 22 is a perspective view schematically illustrating a display apparatus 2 according to an embodiment, FIGS. 23A to 23C are cross-sectional views schematically illustrating a portion of the display apparatus 2 of FIG. 22, and FIG. 24 is a plan view schematically illustrating a display panel 10-1 included in the display apparatus 2 of FIG. 22.

Specifically, FIGS. 22 and 24 respectively illustrate shapes thereof after and before the side display area SDA and the corner display area CDA of the display panel 10-1 are bent. Also, FIGS. 23A and 23B respectively correspond to cross-sectional views of the display apparatus 2 taken in the x direction and the y direction of FIG. 22, and FIG. 23C illustrates a cross-section view in which the corner display area CDA is arranged on both sides of the front display area FDA in the display apparatus 2 of FIG. 22.

Referring to FIGS. 22 and 23A to 23C, an embodiment of the display apparatus 2 may have a side in a first direction (e.g., x direction) and a side in a second direction (e.g., y direction). In such an embodiment, a corner CN of the display apparatus 2 may be rounded to have a certain curvature. Here, "the corner CN" may refer to a corner portion where the side in the first direction and the side in the second direction meet each other.

Although FIG. 22 illustrates an embodiment where the side in the second direction is longer than the side in the first direction, the disclosure is not limited thereto. In one alternative embodiment, for example, the length of the side in the first direction and the length of the side in the second direction may be equal to each other, or the length of the side in the first direction may be greater than the length of the side in the second direction.

The display apparatus 2 may include a display panel 10-1 and a cover window 20-1.

The display panel 10-1 may include a display area DA for displaying an image and a peripheral area PA surrounding the display area DA.

In an embodiment, the display panel 10-1 may display an image in a front area, a side area, and/or a corner area of the display panel 10-1. The display area DA may include a front display area FDA, a side display area SDA, a corner display area CDA, and a middle display area MDA. A plurality of pixels PX including light emitting devices may be arranged in each of the front display area FDA, the side display area SDA, the corner display area CDA, and the middle display area MDA, and an image may be displayed through the plurality of pixels PX therein.

The front display area FDA may be a display area DA located at the front surface of the display panel 10-1. A first pixel PX1 including a light emitting device may be arranged in the front display area FDA. The front display area FDA may have a flat shape.

The side display area SDA may be a display area DA located at the side surface of the display panel 10-1. The side display area SDA may be connected to one side of the front display area FDA. The side display area SDA may include a first side display area SDA1, a second side display area SDA2, a third side display area SDA3, and/or a fourth side display area SDA4 that are respectively connected to the sides of the front display area FDA.

The side display area SDA may be curved with a radius of curvature and may have a curved shape. In an embodiment, the first to fourth side display areas SDA1, SDA2, SDA3, and SDA4 may have the same radius of curvature. In an alternative embodiment, two or more of the first to fourth side display areas SDA1, SDA2, SDA3, and SDA4 may have different radii of curvature. Hereinafter, for convenience of description, an embodiment where the first side display area SDA1 and the third side display area SDA3 have a same first curvature radius R1 and the second side display area SDA2 and the fourth side display area SDA4 have a same second curvature radius R2 will be described in detail. In such an embodiment, the first curvature radius R1 and the second curvature radius R2 may be equal to or different from each other.

The corner display area CDA may be a display area DA located at the corner CN of the display panel 10-1. A second pixel PX2 including a light emitting device may be arranged in the corner display area CDA. The corner display area CDA may be arranged between the adjacent side display areas SDA. In one embodiment, for example, as illustrated in FIG. 22, the corner display area CDA may be arranged between the first side display area SDA1 and the second side display area SDA2, between the second side display area SDA2 and the third side display area SDA3, between the third side display area SDA3 and the fourth side display area SDA4, and/or between the fourth side display area SDA4 and the first side display area SDA1.

The corner display area CDA may have a third radius of curvature R3 and may have a curved shape. In an embodiment, the third radius of curvature R3 may vary according to a point therein. In an embodiment, the change of the third radius of curvature R3 may depend on the radius of curvature of the adjacent side display areas SDA. In one embodiment, for example, the third radius of curvature R3 of the corner display area CDA between the first side display area SDA1 and the second side display area SDA2 may depend on the first radius of curvature R1 of the first side display area SDA1 and the second radius of curvature R2 of the second side display area SDA2. In one embodiment, for example, where the first radius of curvature R1 is less than the second radius of curvature R2, the radius of curvature of the corner display area CDA may increase gradually from the first side display area SDA1 to the second side display area SDA2. In such an embodiment, the third radius of curvature R3 of the corner display area CDA may vary within the range of the first radius of curvature R1 or more to the second radius of curvature R2 or less.

The middle display area MDA may be a display area DA located between the corner display area CDA and the front display area FDA. A third pixel PX3 including a light emitting device may be arranged in the middle display area MDA. The middle display area MDA may extend between the adjacent side display areas SDA and the corner display area CDA. In one embodiment, for example, as illustrated in FIG. 22, the middle display area MDA may extend between the first side display area SDA1 and the corner display area CDA and between the second side display area SDA2 and the corner display area CDA.

In an embodiment, a driving circuit DC for providing an electric signal and/or a voltage line for providing a voltage may be arranged in the middle display area MDA, and the third pixel PX3 may overlap the driving circuit DC and/or the voltage line. In such an embodiment, the light emitting device of the third pixel PX3 may be arranged on the driving circuit DC and/or the voltage line. In an alternative embodiment, the driving circuit DC and/or the voltage line may be arranged in the peripheral area PA, and the third pixel PX3 may not overlap the driving circuit DC or the voltage line.

The peripheral area PA may be a non-display area that does not display an image. A driving circuit DC for providing an electrical signal to the pixels PX of the display area DA, a voltage line for providing a voltage, or the like may be arranged in the peripheral area PA. In one embodiment, for example, the driving circuit DC may be a scan driving circuit that provides a scan signal to each of the pixels PX through a scan line SL. Alternatively, the driving circuit DC may be a data driving circuit (not illustrated) that provides a data signal to each of the pixels PX through a data line DL.

The peripheral area PA may include a pad portion (not illustrated) that is an area to which an electronic device, a printed circuit board, or the like may be electrically connected. The pad portion may be exposed by not being covered by an insulating layer, to be electrically connected to a flexible printed circuit board ("FPCB"). The FPCB may electrically connect a controller to the pad portion and may supply a signal or voltage transmitted from the controller.

Figure 25:
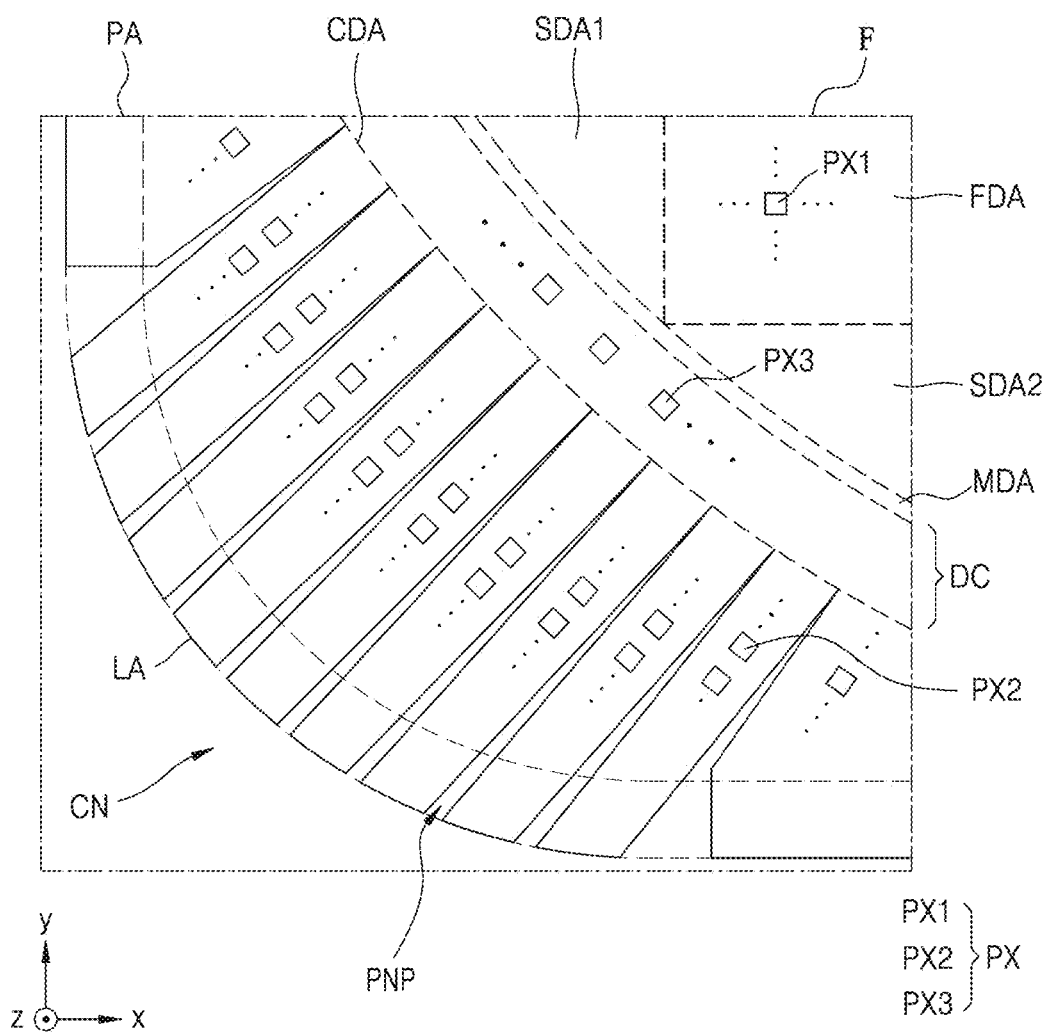
FIG. 25 is an enlarged plan view schematically illustrating a portion of the display panel of FIG. 24.

FIG. 25 is an enlarged plan view schematically illustrating a portion (region F) of the display panel 10-1 of FIG. 24. Hereinafter, like reference numerals in the drawings may refer to like elements, and, any repetitive detailed descriptions of the same or like elements as those described above will be omitted for conciseness.

When the corner display area CDA is bent, a compressive strain may occur in the corner display area CDA more greatly than a tensile strain and a portion of the display panel 10-1 may be damaged due to a corresponding compressive stress. Thus, the corner display area CDA may have a substrate 100 (see FIG. 24) and a multilayer structure over the substrate 100, which are different from those of the front display area FDA.

Referring to FIG. 25, the substrate 100 may include a plurality of extension areas LA. The extension areas LA may extend in a direction away from the front display area FDA and may at least partially overlap the corner display area CDA and/or the peripheral area PA. Second pixels PX2 may be arranged over the extension areas LA overlapping the corner display area CDA. In an embodiment, the second pixels PX2 may be arranged in a direction in which the extension area LA extends.

A penetration portion PNP defined through the display panel 10-1 may be defined between a plurality of adjacent extension areas LA. The penetration portion PNP may function to reduce a compressive stress caused by a compressive strain generated when the corner display area CDA is bent. Particularly, as the corner display area CDA is bent, a compressive stress may not be applied but the area of the penetration portion PNP may decrease such that the extension areas LA may become close to each other.

Accordingly, damage to the display panel 10-1 may be prevented when the corner display area CDA is bent.

Figure 26:
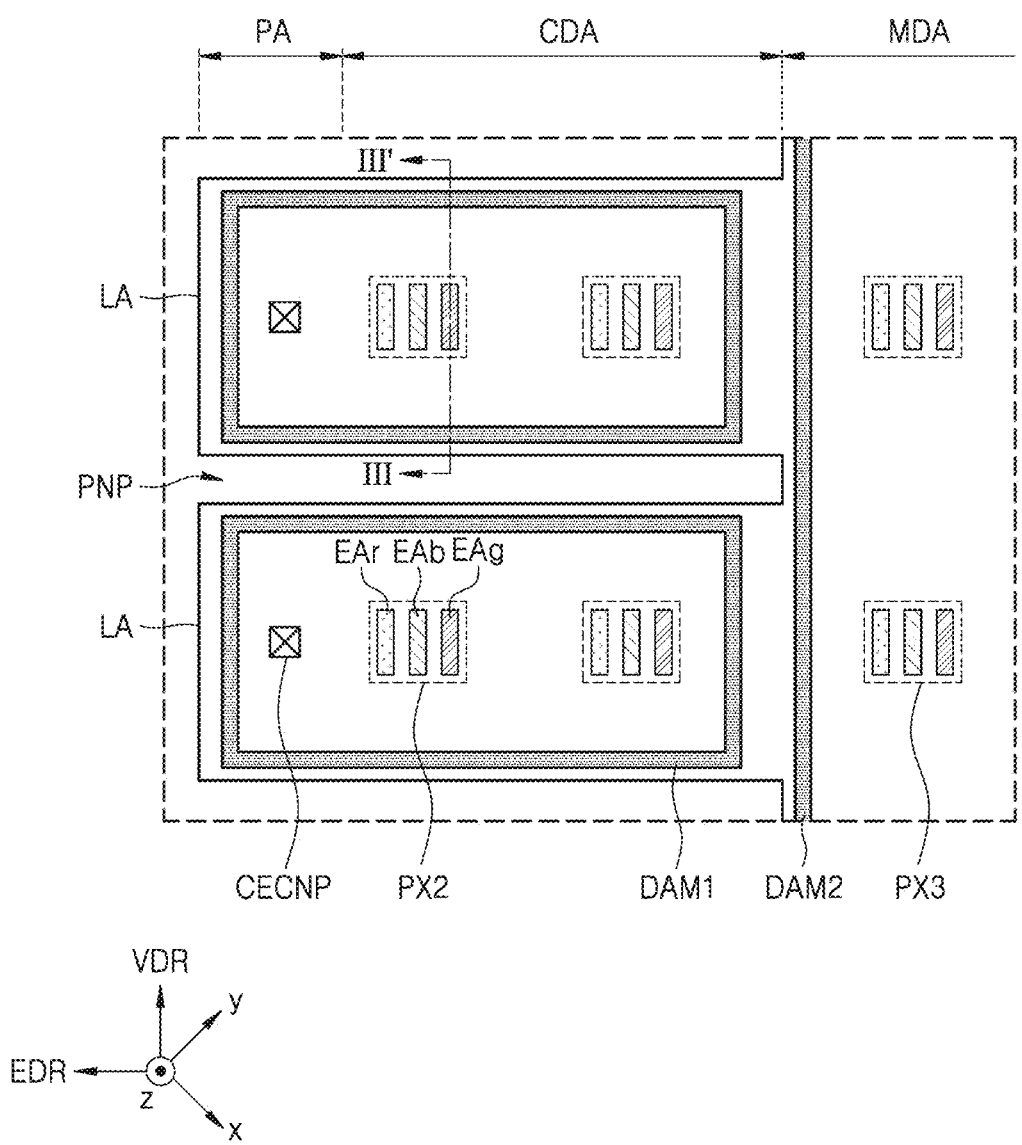
FIG. 26 is an enlarged plan view schematically illustrating a portion of the display panel of FIG. 24.

FIG. 26 is an enlarged plan view schematically illustrating a portion of the extension areas LA as a portion of the display panel 10-1 of FIG. 24.

Referring to FIG. 26, in an embodiment, the extension areas LA may overlap at least a portion of the corner display area CDA and at least a portion of the peripheral area PA. In such an embodiment, the extension areas LA may be arranged across the corner display area CDA and the peripheral area PA and may extend in a direction away from the front display area FDA (see FIG. 24) or the middle display area MDA. In an embodiment, the extension areas LA may extend in an extension direction EDR. Here, "the extension direction EDR" may be a direction intersecting with the first direction (e.g., the x direction) and the second direction (e.g., the y direction).

The extension areas LA may be arranged in a direction intersecting with the extension direction EDR. In an embodiment, as illustrated in FIG. 26, the extension areas LA may be arranged in a vertical direction VDR perpendicular to the extension direction EDR.

The extension areas LA may be spaced apart from each other. Penetration portions PNP may be defined or formed between the extension areas LA by a space in which the extension areas LA are spaced apart. In such an embodiment, at least a portion of the edge of the extension areas LA may define at least a portion of the penetration portions PNP. The substrate 100 (see FIG. 24) and the components over the substrate 100 may not be arranged in the penetration portions PNP.

Second pixels PX2 arranged in the corner display area CDA may be arranged in the extension areas LA. Third pixels PX3 may be arranged in the middle display area MDA. In such an embodiment, the number of emission areas included in each of the pixels PX (see FIG. 24), the pattern in which the emission areas are arranged, the area of each of the emission areas, and the pattern in which the pixels PX are arranged are not limited to those show in FIG. 26, and may be variously modified according to design.

FIG. 26 illustrates an embodiment where each of the second pixels PX2 and the third pixels PX3 includes three emission areas EAr, EAb, and EAg that are arranged in a stripe pattern in the extension direction EDR. Alternatively, each of the second pixels PX2 and the third pixels PX3 may include one, two, or four or more emission areas. The emission areas may be arranged in a stripe pattern or a pentile pattern arranged in a direction (e.g., the vertical direction VDR) intersecting with the extension direction EDR. In such embodiments, the areas of the emission areas may be equal to or different from each other.

A first dam portion DAM1 may be arranged over each of the extension areas LA. The first dam portion DAM1 may entirely surround the second pixels PX2 arranged over the extension area LA. A second dam portion DAM2 may be arranged in an area adjacent to the boundary between the extension area LA and the middle display area MDA or the boundary between the corner display area CDA and the middle display area MDA. Each of the first dam portion DAM1 and the second dam portion DAM2 may control the flow of an organic encapsulation layer 320 (see FIG. 27A). In an embodiment, the first dam portion DAM1 and the second dam portion DAM2 may separate the organic encapsulation layer 320 to form an encapsulation structure for each extension area LA. The first dam portion DAM1 and the second dam portion DAM2 may have a same structure as the dam portion 119 (see FIG. 5A) described above.

In an embodiment, a connection portion CECNP and a connection line (not illustrated) for supplying a voltage may be located in the extension area LA. In one embodiment, for example, the connection portion CECNP may be located at an end portion of the extension area LA. The connection line may be configured to supply a voltage to the second pixel PX2 through the connection portion CECNP.

Figure 27A:
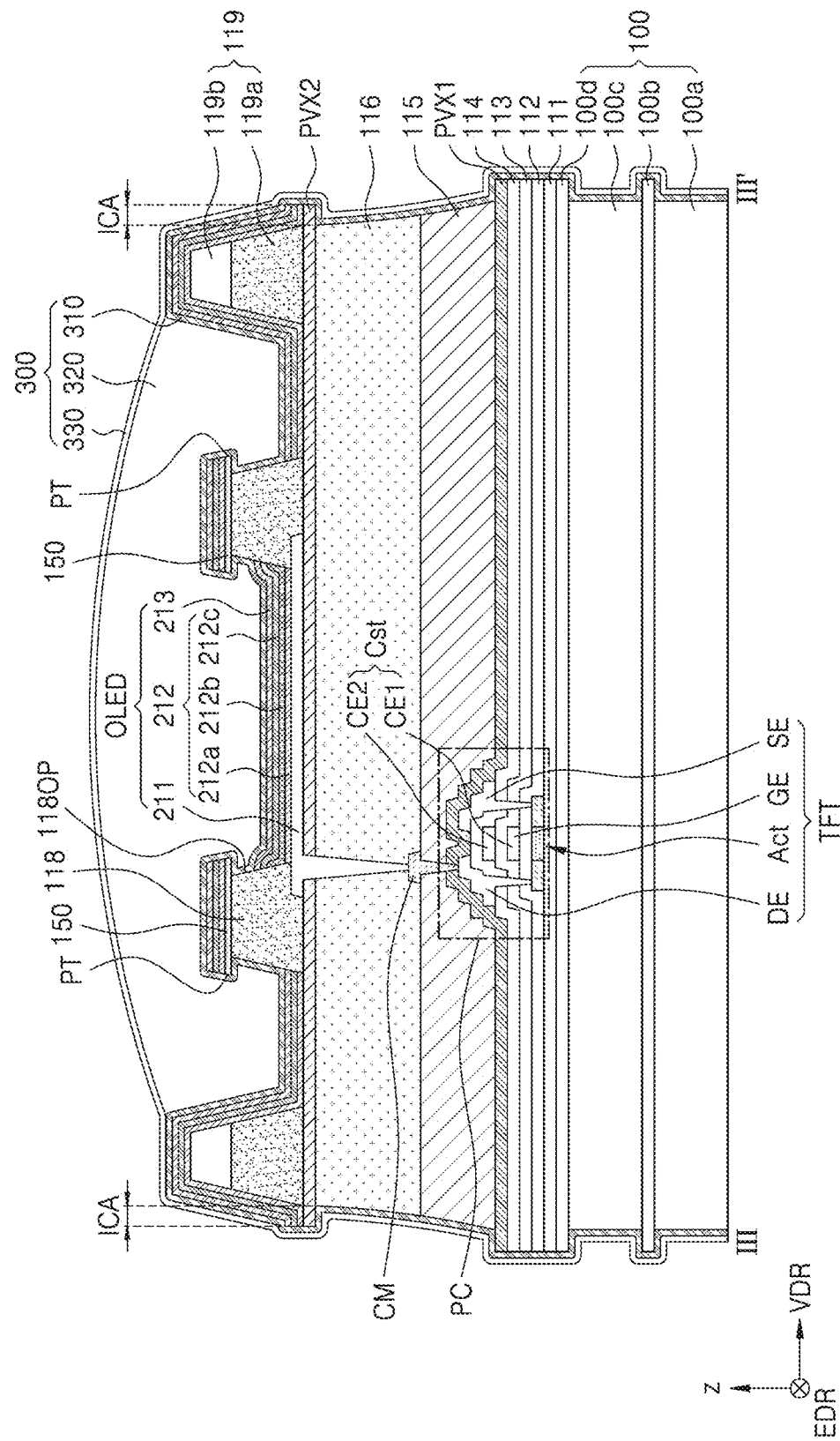
FIG. 27A is a cross-sectional view schematically illustrating a portion of a display apparatus according to an embodiment.
Figure 27B:
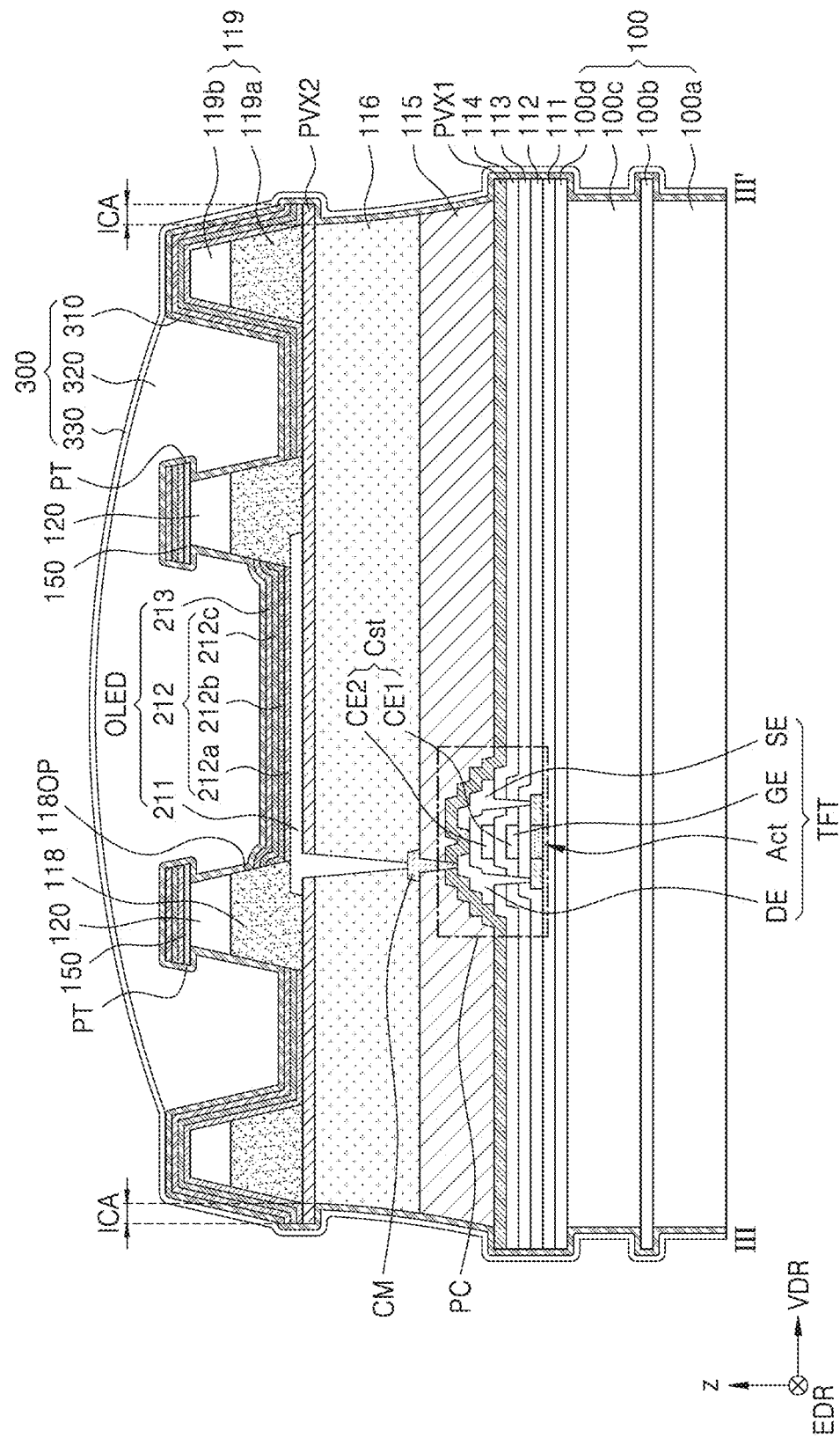
FIG. 27B is a cross-sectional view schematically illustrating a portion of a display apparatus according to an alternative embodiment.
Figure 27C:
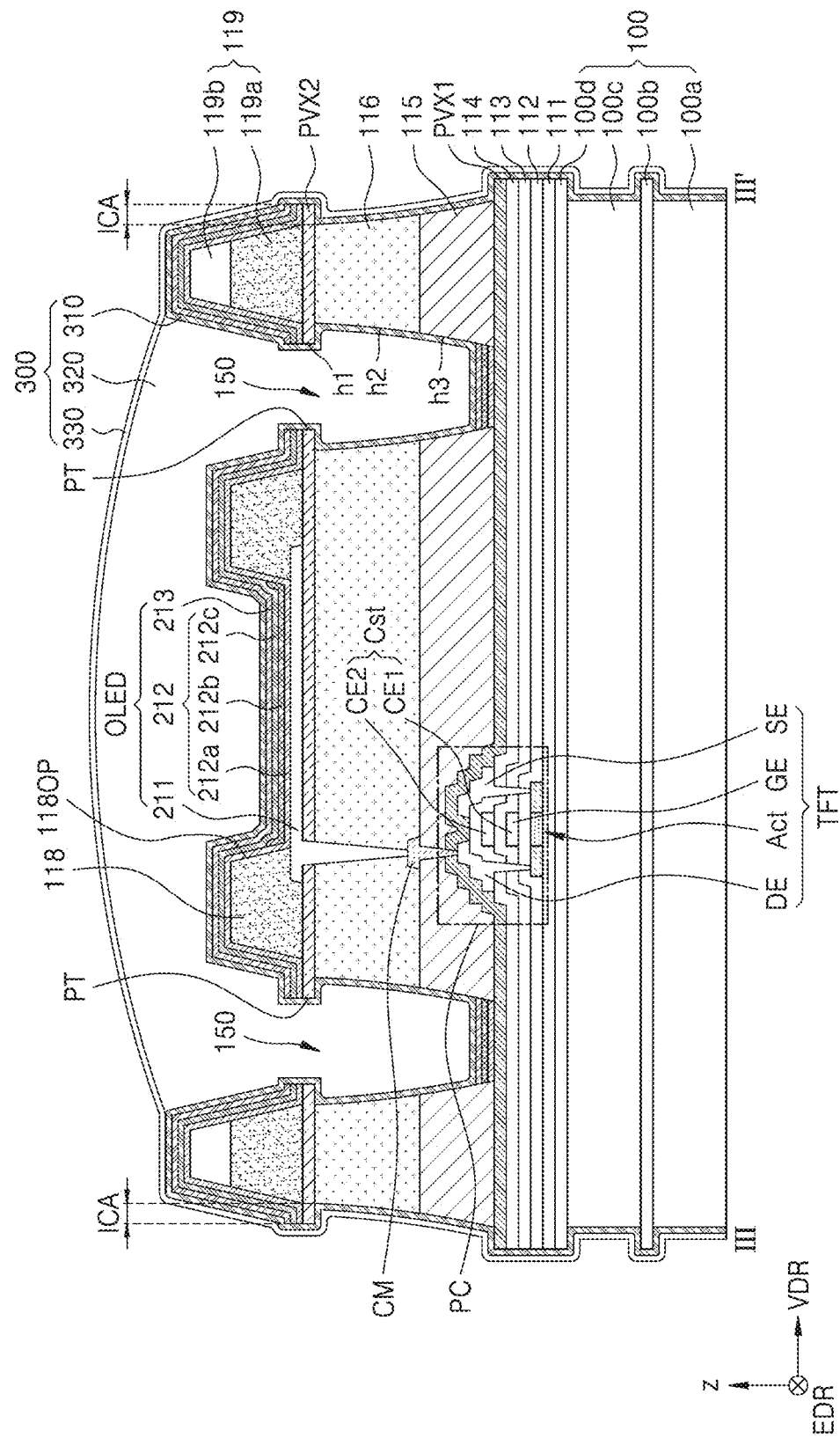
FIG. 27C is a cross-sectional view schematically illustrating a portion of a display apparatus according to another alternative embodiment.

FIGS. 27A to 27C are cross-sectional views schematically illustrating a portion of a display apparatus according to an embodiment. FIGS. 27A to 27C may correspond to cross-sectional views of the display apparatus taken along line III-III' of FIG. 26. FIGS. 27A to 27C respectively illustrate embodiments where the structures of FIGS. 5A to 5C described above are similarly applied to the extension area LA (see FIG. 24) of the display panel 10-1 (see FIG. 26). Thus, any repetitive detailed descriptions of the same or like elements as those described above with reference to FIGS. 5A to 5C will be omitted for conciseness.

Referring to FIGS. 27A to 27C, in an embodiment, each of the extension areas LA may include an individual encapsulation structure. In such an embodiment, the substrate 100 described above, a pixel circuit PC disposed on or located over the substrate 100, and a light emitting device (e.g., an organic light emitting diode OLED) electrically connected to the pixel circuit PC may be arranged in each of the extension areas LA.

In an embodiment, the substrate 100 may include a first base layer 100a, a first barrier layer 100b, a second base layer 100c, and a second barrier layer 100d that are sequentially stacked. In such an embodiment, a buffer layer 111, a gate insulating layer 112, a first interlayer insulating layer 113, a second interlayer insulating layer 114, a first inorganic insulating layer PVX1, a first organic insulating layer 115, a second organic insulating layer 116, and a second inorganic insulating layer PVX2 may be sequentially stacked between the substrate 100 and the organic light emitting diode OLED.

A pixel definition layer 118 in which a pixel opening 1180P for defining an emission area of the organic light emitting diode OLED is defined, a first dam portion DAM1 (see FIG. 26), and an encapsulation layer 300 may be disposed on or located over the second inorganic insulating layer PVX2.

The second pixels PX2 (see FIG. 26) arranged over the extension area LA may be at least partially surrounded by an inorganic contact area ICA. In one embodiment, for example, when viewed in a direction perpendicular to the upper surface of the substrate 100, the inorganic contact area ICA may be disposed or formed along the edge of the extension area LA.

Each of the organic light emitting diodes OLED arranged over the extension area LA may also include a first electrode 211, a second electrode 213, and an intermediate layer 212 arranged therebetween. In an embodiment, as illustrated in FIGS. 27A to 27C, the disconnection portion 150 illustrated in each of FIGS. 5A to 5C may be located over the extension area LA. Because the structural features and effects of the disconnection portion 150 are the same as those described above, any repetitive detailed descriptions thereof will be omitted for conciseness.

As described above, according to an embodiment, a display apparatus may have improved light efficiency while preventing damage to a display apparatus when a substrate is deformed, and a method of manufacturing the display apparatus may be effectively performed without using a separate mask process.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display apparatus comprising:
    a substrate comprising a first area and a plurality of second areas extending from the first area in different directions from each other;
    a light emitting device disposed on the first area, wherein the light emitting device comprises a first electrode, a second electrode, and an intermediate layer disposed between the first electrode and the second electrode;
    a first organic layer which is disposed on the first area and extends such that the light emitting device is disposed in an inside thereof, where a distance from an upper surface of the first organic layer to an upper surface of the substrate is greater than a distance from an upper surface of the first electrode to the upper surface of the substrate; and
    a disconnection portion disposed on the first organic layer, wherein the disconnection portion comprises a tip, an edge of an upper surface of which protrudes more in a direction away from a center of the first organic layer than an edge of the upper surface of the first organic layer.

2. The display apparatus of claim 1, wherein
the intermediate layer comprises a functional layer, and
the functional layer covers the first area and comprises a portion disposed on the disconnection portion and disconnected by the tip.

3. The display apparatus of claim 1, wherein the second electrode covers the first area and comprises a portion disposed on the disconnection portion and disconnected by the tip.

4. The display apparatus of claim 1, further comprising:
a pixel definition layer disposed on or the first electrode, wherein a pixel opening is defined through the pixel definition layer to expose a portion of the upper surface of the first electrode,
wherein the first organic layer and the pixel definition layer comprise a same material as each other and have a same layer structure as each other.

5. The display apparatus of claim 1, further comprising:
a pixel definition layer disposed on the first electrode, wherein a pixel opening is defined through the pixel definition layer to expose a portion of the upper surface of the first electrode; and
an additional organic layer disposed on the pixel definition layer, an opening is defined through the additional organic layer to overlap the pixel opening,
wherein the first organic layer and the additional organic layer comprise a same material as each other and have a same layer structure as each other.

6. The display apparatus of claim 1, wherein the disconnection portion comprises:
a first portion which covers at least a portion of the upper surface of the first organic layer, wherein a shape of a lower surface of the first portion is substantially the same as a shape of a corresponding portion of the upper surface of the first organic layer;
a second portion which extends from an end of the first portion to an edge of the first organic layer, wherein a shape of a lower surface of the second portion is substantially the same as the shape of a corresponding portion of the upper surface of the first organic layer; and
a third portion extending from an end of the second portion in a direction away from the first organic layer.

7. The display apparatus of claim 1, wherein the disconnection portion comprises:
a first portion which covers at least a portion of the upper surface of the first organic layer, wherein a shape of a lower surface of the first portion substantially the same as a shape of a corresponding portion of the upper surface of the first organic layer; and
a second portion which extends from an end of the first portion in a direction away from the first organic layer, wherein a lower surface of the second portion is spaced apart from the upper surface of the first organic layer.

8. The display apparatus of claim 1, further comprising:
an encapsulation layer covering an upper surface of the second electrode, a side surface of the first organic layer, and a side surface of the disconnection portion,
wherein the encapsulation layer comprises an inorganic encapsulation layer and an organic encapsulation layer.

9. The display apparatus of claim 1, further comprising:
a power supply line disposed on at least one of the plurality of second areas and extending toward the first area; and
a connection electrode disposed on the first area and electrically connected to the second electrode and the power supply line.

10. The display apparatus of claim 9, further comprising:
a second organic layer covering at least a portion of the connection electrode and at least a portion of the first electrode,
wherein the disconnection portion does not overlap the second organic layer.

* * * * *